US011370200B2

(12) United States Patent
Hosoda et al.

(10) Patent No.: US 11,370,200 B2
(45) Date of Patent: Jun. 28, 2022

(54) FLUORORESIN FILM AND LAMINATE, AND METHOD FOR PRODUCING HOT PRESSED LAMINATE

(71) Applicant: AGC Inc., Chiyoda-ku (JP)

(72) Inventors: Tomoya Hosoda, Chiyoda-ku (JP); Tatsuya Terada, Chiyoda-ku (JP); Atsumi Yamabe, Chiyoda-ku (JP); Nobutaka Kidera, Chiyoda-ku (JP); Wataru Kasai, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/660,895

(22) Filed: Oct. 23, 2019

(65) Prior Publication Data

US 2020/0048420 A1 Feb. 13, 2020

Related U.S. Application Data

(63) Continuation of application No. PCT/JP2018/019144, filed on May 17, 2018.

(30) Foreign Application Priority Data

May 18, 2017 (JP) .............................. JP2017-099295
Aug. 30, 2017 (JP) .............................. JP2017-165911
Jan. 24, 2018 (JP) .............................. JP2018-010004

(51) Int. Cl.
*B32B 27/00* (2006.01)
*C08F 214/26* (2006.01)
(Continued)

(52) U.S. Cl.
CPC .......... *B32B 27/00* (2013.01); *C08F 214/265* (2013.01); *C08J 5/121* (2013.01);
(Continued)

(58) Field of Classification Search
CPC .. B32B 27/00; C08F 214/265; C08F 2800/10; C08F 214/262; C08J 5/121;
(Continued)

(56) References Cited

U.S. PATENT DOCUMENTS 6,156,434 A 12/2000 Hayashi et al.
2009/0097890 A1* 4/2009 Oyama .............. G03G 15/2053
399/329

(Continued)

FOREIGN PATENT DOCUMENTS

JP 02-245330 A 10/1990
JP 09-118763 A 5/1997
(Continued)

OTHER PUBLICATIONS

Translation of Yokura et al. JP2017002115A (Year: 2017).*
(Continued)

*Primary Examiner* — Duy Vu N Deo
(74) *Attorney, Agent, or Firm* — Oblon, McClelland, Maier & Neustadt, L.L.P.

(57) ABSTRACT

The purpose of the present invention is to provide a fluororesin film or fluororesin laminate excellent in heat resistance and excellent in interlayer adhesion to an object to be laminated, such as a prepreg, a method for producing a hot pressed laminate using said film or laminate, and a method for producing a printed circuit board. The fluororesin film contains a fluororesin having a melting point of from 260 to 380° C., and has an arithmetic average roughness Ra of at least 3.0 nm when inside of 1 μm² of at least one surface thereof in the thickness direction is measured by an atomic force microscope. The laminate 1 has a layer A10 containing said fluororesin and a layer B12 made of another substrate, wherein the layer A10 has an arithmetic average roughness Ra of at least 3.0 nm when inside of 1 μm² of a second (Continued)

surface 10b thereof is measured by an atomic force microscope.

15 Claims, 3 Drawing Sheets

(51) Int. Cl.
  *C08J 5/12*     (2006.01)
  *C08J 5/18*     (2006.01)
  *C08J 5/24*     (2006.01)
  *H05K 1/02*    (2006.01)
  *H05K 1/03*    (2006.01)
  *H05K 3/02*    (2006.01)

(52) U.S. Cl.
  CPC . *C08J 5/18* (2013.01); *C08J 5/24* (2013.01); *H05K 1/024* (2013.01); *H05K 1/036* (2013.01); *H05K 3/022* (2013.01); *C08F 2800/10* (2013.01); *C08J 2327/18* (2013.01); *C08J 2363/00* (2013.01); *C08J 2371/12* (2013.01); *H05K 2201/015* (2013.01); *H05K 2203/068* (2013.01)

(58) Field of Classification Search
  CPC ... C08J 5/18; C08J 5/24; C08J 2327/18; C08J 2363/00; C08J 2371/12; H05K 1/024; H05K 1/036; H05K 3/022; H05K 2201/015; H05K 2203/068; H05K 1/0326; C09J 2203/326; C09J 2427/00; C09J 7/28; C09J 7/35; C09D 127/18
  USPC ......................................................... 257/759
  See application file for complete search history.

(56) References Cited

U.S. PATENT DOCUMENTS

| | | | |
|---|---|---|---|
| 2009/0098465 A1* | 4/2009 | Kikuchi | B29C 55/085 429/253 |
| 2010/0000771 A1* | 1/2010 | Shimauchi | B32B 7/12 174/257 |
| 2016/0183380 A1* | 6/2016 | Ishii | B32B 15/20 428/601 |

FOREIGN PATENT DOCUMENTS

| | | |
|---|---|---|
| JP | 2012-197347 A | 10/2012 |
| JP | 2016-201510 A | 12/2016 |
| JP | 2017-002115 A | 1/2017 |
| WO | WO 2016/017801 A1 | 2/2016 |

OTHER PUBLICATIONS

Translation of Ariga et al. JPH09118763A (Year: 1997).*
Translation of JP 2016-52733 A (Year: 2016).*
International Search Report dated Aug. 14, 2018 in PCT/JP2018/019144 filed on May 17, 2018.

* cited by examiner

FLUORORESIN FILM AND LAMINATE, AND METHOD FOR PRODUCING HOT PRESSED LAMINATE

TECHNICAL FIELD

The present invention relates to a fluororesin film and a laminate, and a method for producing a hot pressed laminate.

BACKGROUND ART

In recent years, along with weight reduction, size reduction and high densification of electronic products, demand for various printed circuit boards is growing. As a printed circuit board, for example, one obtained by laminating a substrate made of insulating material and a metal foil and patterning the metal foil to form a circuit, is used. The insulating material for the printed circuit board is required to have excellent electrical characteristics (a low dielectric constant, etc.) corresponding to the frequency in the high frequency band, excellent heat resistance to withstand solder reflow, etc.

As an insulating material with a low dielectric constant, useful for a printed circuit board, a fluororesin has been proposed. For example, it has been proposed to use, as a printed circuit board, a laminate of a metal foil and a layer containing a cured product of a thermosetting resin and a fluororesin having a functional group such as a carbonyl group-containing group and a melting point of from 260 to 320° C. (Patent Document 1).

PRIOR ART DOCUMENT

Patent Document

Patent Document 1: WO2016/017801

DISCLOSURE OF INVENTION

Technical Problem

In a printed circuit board, there may, for example, be a case where on the side opposite to a metal foil in the layer containing a fluororesin, an object to be laminated such as a prepreg is laminated by hot pressing. When a fluororesin with a melting point of from 260 to 320° C. is used, it is possible to obtain excellent heat resistance. However, in the case of using a fluororesin with a high melting point at a level of from 260 to 320° C., usually the heat-resistant temperature of the cured product of a prepreg or the like, is lower than the melting point of the fluororesin. Therefore, hot pressing must be done at a temperature close to the heat resistant temperature lower than the melting point of the fluororesin, whereby the fluororesin will not melt sufficiently, and sufficient adhesion tends to be hardly obtainable.

The present invention has an object to provide a fluororesin film or a laminate having a fluororesin layer, excellent in heat resistance, and excellent in interlayer adhesion to an object to be laminated at the time when it is laminated to an object to be laminated such as a prepreg by hot pressing. Further, the present invention has an object to provide a method for producing a hot pressed laminate using said fluororesin film or said laminate, as well as a method for producing a printed circuit board.

Solution to Problem

The present invention has the following embodiments.
[1] A fluororesin film comprising a fluororesin having a melting point of from 260 to 380° C., wherein the arithmetic average roughness Ra when inside of 1 μm² of at least one surface in the thickness direction is measured by an atomic force microscope, is at least 3.0 nm.
[2] A laminate having a layer A made of a material containing a fluororesin having a melting point of from 260 to 380° C., and a layer B made of a material not containing the fluororesin, of which at least one side is made of a surface of said layer A, wherein
at least one of surfaces of the layer A of the laminate is a surface having an arithmetic average roughness Ra of at least 3.0 nm when inside of 1 μm² thereof is measured by an atomic force microscope.
[3] The laminate according to [2], wherein the fluororesin contains a tetrafluoroethylene type polymer, of which the melt viscosity at 380° C. is from $1 \times 10^2$ to $1 \times 10^6$ Pa·s.
[4] The laminate according to [2] or [3], wherein the maximum height Rz when inside of 1 μm² at said surface is measured by an atomic force microscope is at least 80.0 nm.
[5] The laminate according to any one of [2] to [4], wherein the composition ratio of oxygen atoms at said surface is at least 1%, to the total of the three elements of carbon atoms, fluorine atoms and oxygen atoms.
[6] The laminate according to any one of [2] to [5], wherein the composition ratio of fluorine atoms at said surface is at least 25% and at most 65%, to the total of the three elements of carbon atoms, fluorine atoms and oxygen atoms.
[7] The laminate according to any one of [2] to [6], wherein said layer B is a layer of metal substrate.
[8]. The laminate according to [7], wherein said layer of metal substrate is a layer of copper foil, and the maximum height Rz of surface roughness measured based on JIS C6515: 1998 (IEC61249-5-1: 1995) of said copper foil, is at least 1 nm and at most 2.5 μm.
[9] The laminate according to any one of [2] to [8], which is a laminate to be laminated to an object to be laminated by hot pressing by using a surface of said layer A as the lamination surface.
[10] The laminate according to [9], wherein the object to be laminated is a prepreg.
[11] The laminate according to [10], wherein the object to be laminated is a prepreg containing a thermosetting resin as the matrix resin, and the curing temperature of the thermosetting resin is at most the melting point of the fluororesin.
[12] The laminate according to [11], wherein said matrix resin is at least one member selected from the group consisting of an epoxy resin, a polyphenylene oxide, a polyphenylene ether and a polybutadiene.
[13] A laminate having a layer A made of a material containing a fluororesin having a melting point of from 260 to 380° C., and a layer B made of a material not containing the fluororesin, wherein
the layer B contains a structure wherein the layer A and the layer B are directly laminated, and the peel strength at the interface between the layer A and the layer B directly laminated, is at least 5 N/10 mm, and the dielectric constant (20 GHz) is less than 3.6.
[14] The laminate according to [13], wherein the composition ratio of oxygen atoms at the surface in contact with the layer B of the layer A is at least 1% to the total of the three elements of carbon atoms, fluorine atoms and oxygen atoms, and the composition ratio of fluorine atoms is at least 25% and at most 65%.
[15] A method for producing a hot pressed laminate, which comprises laminating by hot pressing an object to be laminated, to said surface having an arithmetic average roughness Ra of at least 3.0 nm, of the fluororesin film as defined in [1] or of the laminate as defined in any one of [2] to [14].

[16] The method for producing a hot pressed laminate according to [15], wherein the hot pressing is conducted at a temperature of at most the melting point of the fluororesin.

[17] A method for producing a hot pressed laminate, which comprises surface-treating a fluororesin film containing a fluororesin having a melting point of from 260 to 380° C. to obtain a fluororesin film, of which the wetting tension of at least one surface in the thickness direction is at least 30 mN/m, and laminating an object to be laminated, on said surface with a wetting tension of at least 30 mN/m of the obtained fluororesin film by hot pressing at a temperature of at most the melting point of the fluororesin.

[18] The method for producing a hot pressed laminate according to any one of [15] to [17], wherein the object to be laminated is a prepreg, a glass member or a ceramic member.

[19] The method for producing a hot pressed laminate according to [18], wherein the object to be laminated is a prepreg.

[20] The method for producing a hot pressed laminate according to [19], wherein the matrix resin of the prepreg is at least one member selected from the group consisting of an epoxy resin, a polyphenylene oxide, a polyphenylene ether and a polybutadiene.

[21] A method for producing a printed circuit board, which comprises producing a hot pressed laminate with said layer B being a metal layer, by the method for producing a hot pressed laminate as defined in any one of [15] to [20], and etching the metal layer to form a patterned circuit to obtain a printed circuit board.

Advantageous Effects of Invention

According to the present invention, it is possible to provide a fluororesin film or a laminate having a fluororesin layer, excellent in heat resistance and excellent in adhesion to an object to be laminated at the time when it is laminated to an object to be laminated such as a prepreg by hot pressing. Further, it is possible to provide a method for producing a hot pressed laminate using the fluororesin film or the laminate, as well as a method for producing a printed circuit board.

DESCRIPTION OF EMBODIMENTS

Figure 1:
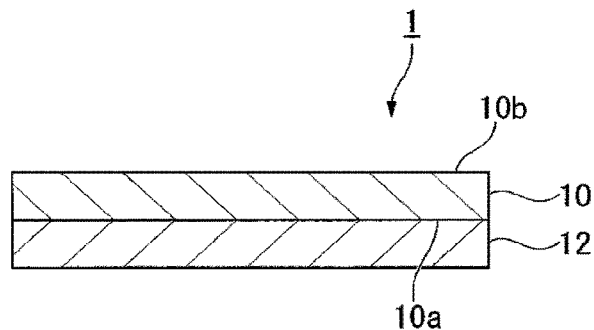
FIG. 1 is a cross-sectional view showing an example of the laminate of the present invention.

The following terms have the following meanings.

With respect to the arithmetic average roughness Ra and the maximum height Rz as measured by an atomic force microscopy (AFM), Ra and Rz of the surface in a range of 1 μm$^2$ were measured by using AFM manufactured by Oxford Instruments, Inc. The measurement conditions are as follows.

Probe: AC160TS-C3 (tip R: <7 nm, spring constant: 26 N/m), measurement mode: AC-Air, scan rate: 1 Hz.

Hereinafter, Ra and Rz of the surface in a range of 1 μm$^2$ measured by AFM will be referred to as Ra (AFM) and Rz (AFM), respectively.

In the present specification, when simply expressed as the "maximum height Rz", such an expression means the "maximum height Rz of surface roughness measured based on JIS C6515: 1998 (IEC61249-5-1: 1995)".

The "melting point" means the temperature corresponding to the maximum value of the melting peak as measured by a differential scanning calorimetry (DSC) method.

Being "melt-moldable" means showing a melt flowability.

"Showing a melt flowability" means that under a condition of a load of 49N, at a temperature higher by at least 20° C. than the melting point of the resin, there is a temperature at which the melt flow rate becomes to be from 0.1 to 1,000 g/10 min.

The "melt flow rate" means the melt mass flow rate (MFR) as stipulated in JIS K7210: 1999 (ISO 1133 1997).

The "dielectric constant" is a value obtained at 1 MHz by a transformer bridge method in accordance with ASTM D150, by an insulation breakdown test equipment (YSY-243-100RHO (manufactured by Yamayo Tester Co.)) in such a test environment that the temperature is maintained in a range of 23° C.±2° C. and the relative humidity is maintained in a range of 50%±5% RH. Further, the dielectric constant in a high frequency zone is a value measured at a frequency of 20 GHz by the SPDR (spirit post dielectric resonator) method under an environment within a range of 23° C.±2° C. and 50±5% RH. Hereinafter, the dielectric constant measured at 1 MHz will be referred to as a "dielectric constant (1 MHz)", and the dielectric constant measured at 20 GHz will be referred to as a "dielectric constant (20 GHz)".

A "unit" in a polymer refers to a polymer moiety derived from one molecule of a monomer, as formed by polymerization of the monomer. A unit may be a polymer moiety formed directly by a polymerization reaction of the monomer, or may be a polymer moiety having a part of the polymer moiety converted to another structure by treating the polymer.

A "monomer" is a compound having a polymerizable unsaturated bond such as a polymerizable double bond.

An "acid anhydride group" means a group represented by —C(=O)—O—C(=O)—.

A "(meth) acrylate" means an acrylate or a methacrylate.

[Fluororesin Film]

The fluororesin film of the present invention is a fluororesin film which contains a fluororesin having a melting point of from 260 to 380° C. and of which Ra (AFM) of at least one surface in the thickness direction is at least 3.0 nm. The fluororesin film of the present invention is particularly effective as a film to be laminated to an object to be laminated by hot pressing.

Hereinafter, a fluororesin having a melting point of from 260 to 380° C. will be referred to as a "fluororesin F".

The melting point of the fluororesin F is from 260 to 380° C. When the melting point of the fluororesin F is at least 260° C., it is excellent in heat resistance. When the melting point of the fluororesin F is at most 380° C., it is excellent in moldability.

Here, the melting point of the fluororesin F can be adjusted by the types and content proportions of units, the molecular weight, etc. of the polymer constituting the fluororesin F.

The melt flow rate of the fluororesin F is preferably from 0.1 to 1,000 g/10 min, more preferably from 0.5 to 100 g/10 min, further preferably from 1 to 30 g/10 min, particularly preferably from 5 to 20 g/10 min. When the melt flow rate is at least the lower limit value in the above range, the fluororesin F is excellent in moldability. When the melt flow rate is at most the upper limit value in the above range, the mechanical strength of the fluororesin film becomes high.

The dielectric constant (1 MHz) of the fluororesin F is preferably at most 2.5, more preferably at most 2.4, particularly preferably from 2.0 to 2.4. As the dielectric constant of the fluororesin F is lower, the electrical characteristics of the fluororesin film becomes better, and excellent transmission efficiency is obtainable when the fluororesin film is used as a substrate for a printed circuit board. The dielectric constant of the fluororesin F can be adjusted by the content of units u1 as described later.

As the fluororesin F, a tetrafluoroethylene-type polymer (hereinafter referred to also as a TFE-type polymer) having a melt viscosity at 380° C. of from $1\times10^2$ to $1\times10^6$ Pa·s is preferred. Here, the melt viscosity of the fluororesin F can be measured in accordance with ASTM D1238, using a flow tester and a die of 2φ-8 L, by maintaining 2 g of a sample preliminarily heated for 5 minutes at the measurement temperature, under a load of 0.7 MPa at the measurement temperature.

The TFE-type polymer preferably has a melt viscosity at 340° C. of from $1\times10^2$ to $1\times10^6$ Pa·s, particularly preferably has a melt viscosity at 300° C. of from $1\times10^2$ to $1\times10^6$ Pa·s.

The TFE-type polymer is a polymer containing units (hereinafter referred to also as "units u1") derived from tetrafluoroethylene (hereinafter referred to as TFE). The TFE-type polymer may be a homopolymer of TFE, or a copolymer of TFE and a monomer (hereinafter referred to also as a comonomer) copolymerizable with TFE. Further, the TFE-type polymer preferably contains at least 90 mol % of units u1 to all units contained in the polymer.

As the TFE-type polymer, a low molecular weight polytetrafluoroethylene (hereinafter referred to also as PTFE) as described below and a fluorinated polymer F as described below may be mentioned.

The low molecular weight PTFE may be not only PTFE, of which the melt viscosity at 380° C. as the entire polymer is from $1\times10^2$ to $1\times10^6$ Pa·s, but also PTFE having a core-shell structure comprising a core portion and a shell portion, wherein only the shell portion satisfies the above melt viscosity.

The low molecular weight PTFE may be PTFE obtainable by irradiating radiation to a high molecular weight PTFE (the melt viscosity is from about $1\times10^9$ to $1\times10^{10}$ Pa·s) (WO2018/026012, WO2018/026017, etc.), or may be PTFE obtainable by reducing the molecular weight by using a chain transfer agent at the time of producing PTFE by polymerizing TFE (JP-A-2009-1745, WO2010/114033).

Here, PTFE may be a polymer obtained by polymerizing TFE alone, or may be a copolymer obtained by copolymerizing TFE with a comonomer (WO2009/20187, etc.). To all units contained in the polymer, units derived from TFE are preferably at least 99.5 mol %, more preferably at least 99.8 mol %, further preferably at least 99.9 mol %. Within the above range, the physical properties of PTFE can be maintained. As the comonomer, a fluorinated monomer as described later may be mentioned, and at least one member selected from the group consisting of hexafluoropropylene (hereinafter referred to also as HFP), a perfluoro(alkyl vinyl ether) (hereinafter referred to also as PAVE) and a fluoroalkyl ethylene (hereinafter referred to also as FAE) is preferred.

The PTFE having a core-shell structure may be PTFE described in JP-A-2005-527652, WO2016/170918, etc. In order to bring the melt viscosity of the shell portion to the above range, a method of reducing the molecular weight of the shell portion by using a chain transfer agent (JP-A-2015-232082, etc.), or a method of copolymerizing TFE and the above comonomer at the time of the preparation of the shell portion (JP-A-H09-087334, etc.), may be mentioned.

In the latter case, the amount of the comonomer to be used, is preferably from about 0.001 to 0.05 mol %, to TFE. Further, not only the shell portion, but also the core portion may be prepared by copolymerization. Also in this case, the amount of the comonomer to be used, is preferably from 0.001 to 0.05 mol %, to TFE.

The standard specific gravity (hereinafter referred to also as SSG) of the low molecular weight PTFE is preferably from 2.14 to 2.22, more preferably from 2.16 to 2.20. SSG can be measured in accordance with ASTM D4895-04.

A fluorinated polymer F is a copolymer of TFE and a comonomer, and contains more than 0.5 mol % of units based on the comonomer to all units contained in the polymer. The fluorinated polymer F can be melt-moldable. The melting point of the fluorinated polymer F is preferably from 260 to 320° C., more preferably from 280 to 320° C., further preferably from 295 to 315° C., particularly preferably from 295 to 310° C. When the melting point of the fluorinated polymer F is at least the lower limit value in the above range, it will be excellent in heat resistance. When the melting point of the fluorinated polymer F is at most the upper limit value in the above range, it will be excellent in melt moldability.

The fluorinated polymer F may be an ethylene/tetrafluoroethylene copolymer (ETFE), a TFE/HFP copolymer (FEP), a TFE/PAVE copolymer (PFA), etc. As the fluorinated polymer F, from the viewpoint of the electric properties (dielectric constant, dielectric loss tangent) and the heat resistance, PFA or FEP is more preferred, and PFA is further preferred.

As the fluororesin F, preferred is an adhesive fluororesin (hereinafter referred to also as a "fluororesin F1") having at least one adhesive functional group selected from the group consisting of a carbonyl group-containing group, a hydroxy group, an epoxy group, an amide group, an amino group and an isocyanate group and having a melting point of from 260 to 320° C. Further, the fluororesin F may be a fluororesin (hereinafter referred to also as a "fluororesin F2") having no adhesive functional group and having a melting point of from 260 to 320° C.

As the fluororesin F, either a fluororesin F1 or a fluororesin F2 may be used alone, or a fluororesin F1 and a fluororesin F2 may be used in combination.

In the fluororesin F1, one having adhesive functional groups among the above-mentioned fluorinated copolymers may be included. In the fluororesin F2, one having no adhesive functional group among the above-mentioned low molecular weight PTFE and fluorinated copolymers may be included.

Further, by plasma treatment, etc. to be described later, it is also possible to impart adhesive functional groups to the fluororesin F2. In such a case, the fluororesin after being treated becomes to be a fluororesin F1.

The adhesive functional groups which the fluororesin F1 has, may be of one type, or may be of two or more types. As the adhesive functional group, from the viewpoint of the interlayer adhesion of the fluororesin film layer and the object to be laminated in a hot pressed laminate, preferred is a carbonyl group-containing group.

The carbonyl group-containing group may, for example, be a group having a carbonyl group between carbon atoms of a hydrocarbon group, a carbonate group, a carboxy group, a haloformyl group, an alkoxycarbonyl group, an acid anhydride group, etc.

The hydrocarbon group in the group having a carbonyl group between carbon atoms of a hydrocarbon group, may, for example, be a $C_{2-8}$ alkylene group. The number of carbon atoms in the alkylene group is the number of carbon atoms that does not contain carbon atoms of the carbonyl group.

The haloformyl group is represented by —C(=O)—X (where X is a halogen atom). As the halogen atom in the haloformyl group, a fluorine atom, a chlorine atom, etc. may be mentioned, and a fluorine atom is preferred.

The alkoxy group in the alkoxycarbonyl group is preferably a $C_{1-8}$ alkoxy group, particularly preferably a methoxy group or an ethoxy group.

The content of the adhesive functional groups in the fluororesin F1 is, to $1\times10^6$ carbon atoms in the main chain of the fluororesin F1, preferably from 10 to 60,000 pieces, more preferably from 100 to 50,000 pieces, further preferably from 100 to 10,000 pieces, particularly preferably from 300 to 5,000 pieces. When the content of the adhesive functional groups is at least the lower limit value in the above range, the interlayer adhesion between the fluororesin film and the object to be laminated in the hot pressed laminate will be further excellent. When the content of the adhesive functional groups is at most the upper limit value in the above range, the heat resistance, color, etc. of the fluororesin F1 will be good.

The content of the adhesive functional groups can be calculated by obtaining, for example, the proportion (mol %) of units having adhesive functional groups in all units constituting the fluororesin F1 by using an infrared absorption spectrum analysis described in JP-A-2007-314720.

The fluororesin F1 may, for example, be a fluorinated polymer having a unit with a adhesive functional group or a terminal group with an adhesive functional group. Specifically, PFA having an adhesive functional group, FEP having an adhesive functional group, ETFE having an adhesive functional group, etc. may be mentioned.

As the fluororesin F1, the following fluorinated polymer F11 is preferred from such a viewpoint that the interlayer adhesion between the fluororesin film and the object to be laminated in the hot pressed laminate will be excellent, and the electrical characteristics of the fluororesin film will be more excellent.

Fluorinated polymer F11: a fluorinated polymer having units u1, units (hereinafter referred to also as "units u2") derived from a cyclic hydrocarbon monomer having an acid anhydride group (hereinafter referred to also as an "acid anhydride-type monomer"), and units (hereinafter referred to also as "units u3") derived from a fluorinated monomer (but excluding TFE).

As the fluoropolymer F11, a polymer (X) described in WO2018/16644, etc. may be mentioned.

The acid anhydride-type monomer may be itaconic anhydride (hereinafter referred to also as "IAH"), citraconic anhydride (hereinafter referred to also as "CAH"), 5-norbornene-2,3-dicarboxylic anhydride (hereinafter referred to also as "NAH"), maleic anhydride, etc. As the acid anhydride monomer, one type may be used alone, or two or more types may be used in combination.

As the fluorinated monomer to constitute units u3, from such a viewpoint that moldability of the fluoropolymer F11, and flex resistance, etc. of the fluororesin film will be excellent, at least one member selected from the group consisting of HFP, PAVE and FAE is preferred, and PAVE is particularly preferred.

PAVE may be $CF_2$=$CFOCF_3$, $CF_2$=$CFOCF_2CF_3$, $CF_2$=$CFOCF_2CF_2CF_3$ (hereinafter referred to also as "PPVE"), $CF_2$=$CFOCF_2CF_2CF_2CF_3$, $CF_2$=$CFO(CF_2)_8F$, etc., and PPVE is preferred.

FAE is preferably $CH_2$=$CH(CF_2)_2F$, $CH_2$=$CH(CF_2)_3F$, $CH_2$=$CH(CF_2)_4F$, $CH_2$=$CF(CF_2)_3H$, $CH_2$=$CF(CF_2)_4H$, more preferably, $CH_2$=$CH(CF_2)_4F$ (hereinafter referred to also as "PFBE") or $CH_2$=$CH(CF_2)_2F$ (hereinafter referred to also as "PFEE").

Preferred proportions of the respective units to the total amount of units u1, units u2 and units u3 in the fluorinated polymer F11 are as follows.

The proportion of units u1 is preferably from 90 to 99.89 mol %, more preferably from 95 to 99.47 mol %, further preferably from 96 to 98.95 mol %.

The proportion of units u2 is preferably from 0.01 to 3 mol %, more preferably from 0.03 to 2 mol %, further preferably from 0.05 to 1 mol %.

The proportion of units u3 is preferably from 0.1 to 9.99 mol %, more preferably from 0.5 to 9.97 mol %, further preferably from 1 to 9.95 mol %.

In the fluorinated polymer F11, when the proportions of the respective units are within the above ranges, the fluororesin film will be further excellent in flame retardancy, chemical resistance, etc.

When the proportion of unit u2 is within the above range, the interlayer adhesion of the fluororesin film and the object to be laminated, and the interlayer adhesion between the fluororesin film and the metal layer, in the hot pressed laminate, will be further excellent.

When the proportion of units u3 is within the above range, moldability of the fluorinated polymer F11, and flexing resistance, etc. of the fluororesin film, will be further excellent.

The proportions of the respective units can be calculated by a melt NMR analysis, a fluorine content analysis, an infrared absorption spectrum analysis, etc. of the fluorinated polymer X.

The fluorinated polymer F11 may have, in addition to units u1 to u3, units u4 derived from a non-fluorinated monomer (but excluding an acid anhydride monomer).

The non-fluorinated monomer may be an olefin (ethylene, propylene, 1-butene, etc.), a vinyl ester (vinyl acetate, etc.), etc. As the non-fluorinated monomer, one type may be used alone, or two or more types may be used in combination.

As the non-fluorinated monomer, from the viewpoint of excellent mechanical strength, etc. of the fluororesin film, ethylene, propylene and 1-butene are preferred, and ethylene is particularly preferred.

Specific examples of the fluorinated polymer F11 may be a copolymer of TFE, NAH and PPVE (referred to also as a TFE/NAH/PPVE copolymer; the same applies to other copolymers), a TFE/IAH/PPVE copolymer, a TFE/CAH/PPVE copolymer, a TFE/IAH/HFP copolymer, a TFE/CAH/HFP copolymer, a TFE/IAH/PFBE/ethylene copolymer, a TFE/CAH/PFBE/ethylene copolymer, a TFE/IAH/PFEE/ethylene copolymer, a TFE/CAH/PFEE/ethylene copolymer, a TFE/IAH/HFP/PFBE/ethylene copolymer, etc.

As the fluorinated polymer F11, PFA having adhesive functional groups is preferred, and a TFE/NAH/PPVE copolymer, a TFE/IAH/PPVE copolymer, or a TFE/CAH/PPVE copolymer is more preferred.

As the fluororesin F1, a fluorinated polymer having an adhesive functional group as a main chain terminal group may be used. The fluorinated polymer can be produced by a method of polymerizing a monomer by using a chain transfer agent or polymerization initiator to provide an adhesive functional group at the time of the polymerization of the monomer.

The chain transfer agent to provide an adhesive functional group is preferably a chain transfer agent having a carboxy group, an ester bond, a hydroxy group, etc.

Specifically, acetic acid, acetic anhydride, methyl acetate, ethylene glycol, propylene glycol, etc. may be mentioned.

The polymerization initiator to provide an adhesive functional group is preferably a peroxide-type polymerization initiator such as a peroxy carbonate, a diacyl peroxide, or a peroxy ester. Specifically, di-n-propyl peroxydicarbonate, diisopropyl peroxydicarbonate, tert-butylperoxy isopropyl carbonate, bis(4-tert-butylcyclohexyl) peroxydicarbonate, di-2-ethylhexyl peroxydicarbonate, etc. may be mentioned.

The fluororesin film of the present invention may further contain, as the case requires, resins other than the fluororesin F, and additives, within a range not impairing the effects of the present invention.

As the additives, organic fillers, inorganic fillers, etc. are preferred. The additives may be those described in [0070] of WO2018/16644.

Of the fluororesin film of the present invention, Ra (AFM) of at least one surface in the thickness direction is made to be at least 3.0 nm. Thus, in a case where an object to be laminated, such as a prepreg, is laminated by hot pressing on the surface having a Ra (AFM) of at least 3.0 nm, of the fluororesin film, it is possible to obtain superior interlayer adhesion between the fluororesin film and the object to be laminated. Also, in a case where a substrate made of another material such as a metal is laminated on the surface having a Ra (AFM) of at least 3.0 nm, of the fluororesin film, it is possible to obtain excellent interlayer adhesion between the fluororesin film and another substrate.

In the fluororesin film of the present invention, Ra (AFM) may be at least 3.0 nm on only one surface in the thickness direction, or Ra (AFM) may be at least 3.0 nm on both surfaces in the thickness direction.

Ra (AFM) of at least one surface in the thickness direction of the fluororesin film is at least 3.0 nm, preferably at least 9.0 nm, more preferably at least 12 nm. Within the above range, the fluororesin film of the present invention has excellent adhesion.

Rz (AFM) of the surface having a Ra (AFM) of at least 3.0 nm, of the fluororesin film, is preferably at least 80 nm, more preferably at least 100 nm, particularly preferably at least 130 nm. Within the above range, the adhesiveness will be improved.

Further, Ra (AFM) is preferably at most 1 μm, and Rz (AFM) is preferably at most 300 nm.

The fluororesin film of the present invention may be a single layer film or may be a multilayer film.

The thickness of the fluororesin film is preferably from 1 to 3,000 μm. In the case of an application to a printed circuit board, the thickness of the fluororesin film is more preferably from 1 to 2,000 μm, further preferably from 1 to 1,000 μm, particularly preferably from 3 to 50 μm, most preferably from 3 to 15 μm.

The dielectric constant (1 MHz) of the fluororesin film is preferably from 2.0 to 3.5, particularly preferably from 2.0 to 3.0. When the dielectric constant (1 MHz) is at most the upper limit value in the above range, it is useful in an application where a low dielectric constant is required, such as in an application for a printed circuit board. When the dielectric constant (1 MHz) is at least the lower limit value in the above range, the film will be excellent in both adhesion and electrical properties.

The dielectric constant (20 GHz) of the fluororesin film is preferably at most 2.5, more preferably at most 2.4, particularly preferably from 2.0 to 2.4. The lower the dielectric constant (20 GHz), the better the electrical characteristics of the fluororesin film, and, for example, excellent transmission efficiency is obtainable when the fluororesin film is used for a printed circuit board.

(Method for Producing a Fluororesin Film)

The method for producing a fluororesin film may be a method of surface-treating at least one surface of a fluororesin film containing a fluororesin F, so that Ra (AFM) will be at least 3.0 nm.

Further, also in a case where "so that Ra (AFM) will be at least 3.0 nm" is replaced by "so that Ra (AFM) will be at least 3.0 nm and Rz (AFM) will be at least 80.0 nm", it is possible to similarly produce a fluororesin film.

As a method for forming a fluororesin film, a method may be mentioned wherein a dispersion having a resin powder containing a fluororesin F dispersed in a liquid medium is formed into a film and dried, followed by heating to obtain a fluororesin film. Further, a method may also be mentioned wherein said dispersion and a liquid containing a thermoplastic resin other than the fluororesin F, or its raw material (hereinafter collectively referred to also as "a thermoplastic resin, etc.") are mixed to obtain a liquid composition, which is then formed into a film and dried, followed by heating to obtain a fluororesin film.

Further, as the method for producing a fluororesin film, an extrusion molding method, an inflation molding method, etc. may be used.

The resin powder preferably contains the fluororesin F as the main component. When the fluororesin F is the main component, a resin powder with a high bulk density is easily obtainable. The higher the bulk density of the resin powder, the better the handling efficiency. Here, "the resin powder contains the fluororesin F as the main component" means that the proportion of the fluororesin F to the total amount (100 mass %) of the resin powder, is at least 80 mass %. The proportion of the fluororesin F to the total amount (100 mass %) of the resin powder is preferably at least 85 mass %, more preferably at least 90 mass %, particularly preferably 100 mass %.

The average particle diameter of the resin powder is preferably from 0.3 to 6 μm, more preferably from 0.4 to 5 μm, further preferably from 0.5 to 4.5 μm, particularly preferably from 0.7 to 4 μm, most preferably from 1 to 3.5 μm. When the average particle diameter of the resin powder is at least the lower limit value in the above range, flowability of the resin powder will be sufficient and its handling efficiency will be excellent, and since the average particle diameter is small, the filling rate of the resin powder to a thermoplastic resin or the like can be made high. The higher the filling rate, the better the electrical characteristics (the low dielectric constant, etc.) of the fluororesin film formed by using the liquid composition. Further, as the average particle diameter of the resin powder is small, it is possible to reduce the thickness of the fluororesin film formed by using the liquid composition, and, for example, it is easy to make the thickness to be thin so as to be useful for an application to a flexible printed circuit board. When the average particle diameter of the resin powder is at most the upper limit value in the above range, dispersibility of the resin powder in the liquid medium will be excellent. Furthermore, in this range, the surface roughness will be in a preferred range at the time when a film is formed, and the adhesion will be excellent.

The average particle diameter of the resin powder is a volume-based cumulative 50% diameter (D50) obtainable by a laser diffraction scattering method. That is, the particle size distribution is measured by a laser diffraction scattering method; a cumulative curve is obtained by taking the total volume of the population of particles as 100%; and D50 is a particle diameter at a point where the cumulative volume on the cumulative curve becomes 50%.

The volume-based cumulative 90% diameter (D90) of the resin powder is preferably at most 8 μm, more preferably at most 6 μm, particularly preferably from 1.5 to 5 μm. When D90 is at most the upper limit value, dispersibility of the resin powder in the liquid medium will be excellent.

D90 of the resin powder is obtainable by a laser diffraction and scattering method. That is, the particle size distribution is measured by a laser diffraction scattering method; a cumulative curve is obtained by taking the total volume of the population of particles as 100%; and D90 is a particle diameter at a point where the cumulative volume on the cumulative curve becomes 90%.

The loosely packing bulk density of the resin powder is preferably at least 0.05 g/mL, more preferably from 0.05 to 0.5 g/mL, particularly preferably from 0.08 to 0.5 g/m L.

The densely packing bulk density of the resin powder is preferably at least 0.05 g/mL, more preferably from 0.05 to 0.8 g/mL, particularly preferably from 0.1 to 0.8 g/mL.

The larger the loosely packing bulk density or the densely packing bulk density, the better the handling efficiency of the resin powder. Further, it is possible to increase the filling rate of the resin powder to e.g. a thermoplastic resin or the like. When the loosely packing bulk density or the densely packing bulk density is at most the upper limit value in the above range, the resin powder will be useful in a generic process.

As the liquid medium, water; an alcohol such as methanol or ethanol; a nitrogen-containing compound such as N,N-dimethylformamide, N,N-dimethylacetamide or N-methyl-2-pyrrolidone; a sulfur-containing compound such as dimethyl sulfoxide; an ether such as diethyl ether or dioxane; an ester such as ethyl lactate or ethyl acetate; a ketone such as methyl ethyl ketone or methyl isopropyl ketone; a glycol ether such as ethylene glycol monoisopropyl ether; a cellosolve such methyl cellosolve or ethyl cellosolve, etc. may be mentioned.

As the liquid medium, one type may be used alone, or two or more types may be used in combination. Here, the liquid medium is a compound which does not react with the adhesive fluororesin.

The dispersion may contain a surfactant.

The above surfactant is required to be one having at least a fluorinated group and a hydrophilic group, and so long as it has at least a fluorinated group and a hydrophilic group, it is not particularly limited, and it may be one which further contains a lipophilic group.

To the dispersion, it is possible to further incorporate a silicone-type antifoaming agent or a fluorosilicone-type antifoaming agent. Particularly, in the case of a liquid medium of a non-aqueous solvent, it is preferred to use a hydrophilic or water-soluble silicone-type antifoaming agent in order to let the antifoaming agent be present at the interface between the liquid medium and air rather than at the interface between the liquid medium and a fluororesin F.

The content of the liquid medium in the dispersion is preferably from 1 to 1,000 parts by mass, to 100 parts by mass of the resin powder.

In a case where the dispersion contains a surfactant, the content of the surfactant in the dispersion is preferably from 0.1 to 20 parts by mass, more preferably from 0.2 to 10 parts by mass, particularly preferably from 0.3 to 7 parts by mass, to 100 parts by mass of the resin powder.

In a case where the dispersion contains an antifoaming agent, the content of the antifoaming agent in the dispersion may vary depending upon the content of the fluororesin F, but is preferably at most 1 mass % as an active ingredient to the total mass of the dispersion.

In a case where the dispersion contains an inorganic filler, the content of the inorganic filler in the dispersion is preferably from 0.1 to 300 parts by mass, more preferably from 1 to 200 parts by mass, further preferably from 3 to 150 parts by mass, particularly preferably from 5 to 100 parts by mass, most preferably from 10 to 60 parts by mass, to 100 parts by mass of the resin powder.

The liquid composition is a mixed liquid of the above-described dispersion and a liquid containing a thermoplastic resin, etc.

The thermoplastic resin other than the fluororesin F, or its raw material may, for example, be a thermoplastic resin having a reactive group which reacts with an adhesive functional group, or its raw material. The reactive group may be a carbonyl group-containing group, a hydroxy group, an amino group, an epoxy group, etc.

The thermoplastic resin having a reactive group may, for example, be a thermoplastic polyimide (hereinafter referred to also as "TPI").

The raw material for the thermoplastic resin having a reactive group may, for example, be a polyamic acid obtainable by polycondensation of a polycarboxylic acid dianhydride or its derivative and a diamine, as a raw material precursor for TPI. As the raw material for the thermoplastic resin, one type may be used alone, or two or more types may be used in combination.

The raw material for the thermoplastic resin is preferably one whereby the melting point at the time when made into the thermoplastic resin will be at least 280° C. Thus, in a film, etc. formed by the liquid composition, swelling (foaming) due to a heat when exposed to an atmosphere corresponding to solder reflow, tends to be suppressed.

As the thermoplastic resin other than the fluororesin F, or its raw material, one having no reactive group may be used. The thermoplastic resin other than the fluororesin F, having no reactive group may, for example, be a fluororesin having a melting point of less than 260° C. or more than 380° C., having no adhesive functional group, as mentioned above for said other resins.

The thermosetting resin or its raw material may, for example, be a thermosetting resin having a reactive group, or its raw material. As the thermosetting resin or its raw material, one having no reactive group may be used.

The thermosetting resin may be an epoxy resin, an acrylic resin, a phenolic resin, a polyester resin, a polyolefin resin, a modified polyphenylene ether resin, a polyfunctional cyanate resin, a polyfunctional maleimide-cyanate resin, a polyfunctional maleimide resin, a vinyl ester resin, a urea resin, a diallyl phthalate resin, a melamine resin, a guanamine resin, a melamine-urea co-condensation resin, a fluororesin having a reactive group (but excluding a fluororesin F1), etc. From the standpoint of usefulness for an application to a printed circuit board, the thermosetting resin is preferably an epoxy resin, an acrylic resin, a bismaleimide resin or a modified polyphenylene ether resin, particularly preferably an epoxy resin or a modified polyphenylene ether resin. As the thermosetting resin, one type may be used alone, or two or more types may be used in combination.

The weight average molecular weight of the epoxy resin is preferably from 100 to 1,000,000, more preferably from 1,000 to 100,000. When the weight average molecular weight of the epoxy resin is within the above range, the interlayer adhesion between a film, etc. formed by the liquid composition, and another material (such as metal), will be excellent.

The weight average molecular weight of the epoxy resin is measured by gel permeation chromatography (GPC).

The bismaleimide resin may, for example, be a resin composition (BT resin) having a bisphenol A type cyanate resin and a bismaleimide compound used in combination, as described in JP-A-H7-70315, or one described in the invention or its background art disclosed in WO2013/008667.

The raw material for the thermosetting resin having a reactive group is preferably a precursor (polyamic acid) of an aromatic polyimide, more preferably a precursor (polyamic acid) of a wholly aromatic polyimide obtainable by condensation polymerization of an aromatic polycarboxylic acid dianhydride and an aromatic diamine.

Specific examples of the aromatic polycarboxylic acid dianhydride and the aromatic diamine may be those described in [0055] and [0057] of JP-A-2012-145676. One of them may be used alone, or two or more of them may be used in combination.

As the liquid containing a thermoplastic resin or the like, in a case where the thermoplastic resin or the like is in a liquid state, it can be used as it is. In a case where the thermoplastic resin or the like is not in a liquid state, it may be made into a liquid having the thermoplastic resin or the like dissolved or dispersed in a liquid medium which is capable of dissolving or dispersing the thermoplastic resin or the like. The liquid medium which is capable of dissolving or dispersing the thermoplastic resin or the like, is not particularly limited, and, for example, it may be suitably selected from those mentioned as the liquid medium in the dispersion, depending on the type of the thermoplastic resin or the like.

In the case of using a thermosetting resin or its raw material, the liquid composition may contain a curing agent. As the curing agent, a thermosetting agent (a melamine resin, a urethane resin, etc.), an epoxy curing agent (a phenolic novolak resin, isophthalic acid dihydrazide, adipic acid dihydrazide, etc.), etc. may be mentioned.

The content of the resin powder in the liquid composition is preferably from 5 to 500 parts by mass, more preferably from 10 to 400 parts by mass, particularly preferably from 20 to 300 parts by mass, to 100 parts by mass of the thermoplastic resin or the like. When the content of the resin powder is at least the lower limit value in the above range, electrical characteristics of the fluororesin film formed by using the liquid composition will be excellent. When the content of the resin powder is at most the upper limit value in the above range, the resin powder is uniformly easily dispersed in the liquid composition, and mechanical strength of the fluororesin film formed by using the liquid composition will be excellent.

The content of the liquid medium in the liquid composition is preferably from 1 to 1,000 parts by mass, more preferably from 10 to 500 parts by mass, particularly preferably from 30 to 250 parts by mass, to 100 parts by mass in total of the resin powder and the thermoplastic resin or the like. When the content of the liquid medium is at least the lower limit value in the above range, the viscosity of the liquid composition will not be too high, and the coating properties at the time of film forming will be good. When the content of the liquid medium is at most the upper limit value in the above range, the viscosity of the liquid composition will not be too low, and the coating properties at the time of film forming will be good, and since the amount of the liquid composition to be used is small, poor appearance of the film product derived from the step of removing the liquid medium is unlikely to occur.

Here, in a case where a liquid medium is contained in a liquid containing a thermoplastic resin or the like, the content of the liquid medium in the liquid composition is the total content of the liquid medium of the dispersion and the liquid medium of the liquid containing the thermoplastic resin or the like.

In a case where the liquid composition contains a curing agent, the content of the curing agent in the liquid composition is preferably from 0.5 to 2.0 equivalents, more preferably from 0.8 to 1.2 equivalents, to the amount of the reactive groups which the thermosetting resin or its raw material has.

The film-forming method for a dispersion or liquid composition (hereinafter referred to also as the liquid composition or the like) is preferably coating onto a support surface, and by coating on the support, a film made of the liquid composition or the like will be formed. After the film of the liquid composition or like is formed, the liquid medium is evaporated by a method such as heating the film of the liquid composition or the like, to form a solid film having the liquid medium removed or a non-flowable film having at least a part of the liquid medium removed. Hereinafter, the removal of the liquid medium will be referred to also as "drying", and the operation for coating will be referred to also as a "coating operation".

In the drying, it is not always necessary to completely remove the liquid medium, and the drying may be carried out until the coating film can maintain the film shape stably. In the drying, it is preferred to remove at least 50 mass %, out of the liquid medium contained in the liquid composition or the like.

The drying method is not particularly limited, and, for example, the method described in [0091] to [0094] of WO2018/16644 may be mentioned.

In a case where a raw material for a thermoplastic resin is used in a liquid containing a thermoplastic resin or the like, by heating after drying, the raw material for a thermoplastic resin is converted to a thermoplastic resin. For example, in a case where a polyamic acid which is a raw material for TPI, is used, by heating after drying, the polyamic acid is imidized to obtain TPI. In this case, the heating temperature after drying may, for example, be from 350 to 550° C.

In a case where a thermosetting resin is used in a liquid containing a thermoplastic resin or the like, by heating after drying, the thermosetting resin is cured. In the case of using a raw material for a thermosetting resin material (such as a polyamic acid as a precursor for an aromatic polyimide), by heating after drying, the raw material for a thermosetting resin is converted to a thermosetting resin, which is further cured. The heating temperature after drying may be suitably set depending on the type of the thermosetting resin, and, for example, when an epoxy resin is used, it may be made to be from 50 to 250° C.

Drying and subsequent heating may be conducted continuously. The heating after drying may be carried out in one step or may be carried out in two or more stages at different temperatures.

In a case where the fluororesin film of the present invention is produced by film-forming the above dispersion or liquid composition containing a surfactant, the remaining amount of the surfactant in the fluororesin film is preferably less than 8%. In this range the dielectric constant is low, and the film is excellent in electrical characteristics.

As the surface treatment to make Ra (AFM) of at least one surface of the fluororesin film to be at least 3.0 nm, plasma treatment is preferred.

The plasma irradiation apparatus to be used for the plasma treatment is not particularly limited, and may be an apparatus employing a high frequency induction system, a capacitive coupling type electrode system, a corona discharge electrode-plasma jet system, a parallel plate type, a remote plasma type, an atmospheric pressure plasma type, an ICP type high-density plasma type, etc.

The gas to be used for the plasma treatment is not particularly limited, and may be oxygen, nitrogen, a rare gas (argon), hydrogen, ammonia, etc., and a rare gas or nitrogen is preferred, and argon is particularly preferred. One of them may be used alone, or two or more of them may be used in combination.

As the gas to used for the plasma treatment, an argon gas, a mixed gas of argon gas and hydrogen or nitrogen, or a mixed gas of argon gas, nitrogen and hydrogen, is preferred. The oxygen concentration at the time of the plasma treatment, is preferably at most 500 ppm, and may be 0 ppm.

The atmosphere for the plasma treatment is preferably an atmosphere wherein the volume fraction of a rare gas or nitrogen gas is at least 50 vol %, more preferably an atmosphere wherein said volume fraction is at least 70 vol %, further preferably an atmosphere wherein said volume fraction is at least 90 vol %, particularly preferably an atmosphere wherein said volume fraction is 100%. When the volume fraction of a rare gas or nitrogen gas is at least the lower limit value, the surface of the fluororesin film can easily be renewed to be a plasma treated surface with Ra (AFM) being at least 3.0 nm.

In the plasma treatment, Ra (AFM) of the film surface becomes large as the treatment progresses, but if the treatment is conducted too much, Ra (AFM) which once became large, tends to be small again. Therefore, in order that the treatment will not become excessive, the inter-electrode gap, the output of the apparatus, etc., are adjusted to control the energy of electrons generated (about 1 to 10 eV), and the treatment time is set. In the case of adjusting the RF output power in the plasma treatment apparatus, it is preferred to adjust the RF output power to be from 100 to 400 W.

Here, the same applies in a case where said "surface treatment to make Ra (AFM) to be at least 3.0 nm" is replaced by "surface treatment to make Ra (AFM) to be at least 3.0 nm and to make Rz (AFM) to be at least 80.0 nm".

The contact angle of water on the surface of the plasma-treated fluororesin film is preferably at most 114°, more preferably at most 100. The smaller the contact angle, the better the adhesion to another material.

The wetting tension of the surface with Ra (AFM) being at least 3.0 nm, of the plasma-treated fluororesin film, is preferably at least 30 mN/m, more preferably at least 30 mN/m and at most 70 mN/m, further preferably at least 40 mN/m and at most 65 mN/m. The larger the wetting tension, the better the adhesion to another material.

The composition ratio of oxygen atoms at the surface with Ra (AFM) being at least 3.0 nm, of the fluororesin film after the plasma treatment, is preferably at least 1%, more preferably at least 1% and at most 9%, to the total of the three elements of carbon atoms, fluorine atoms and oxygen atoms. When the composition ratio of oxygen atoms is in the above range, it is easy to impart good adhesion. Here, the composition ratio of oxygen atoms at the surface before the plasma pretreatment of the fluororesin film in the present invention, is at least 0%, more preferably at least 0.5%.

The composition ratio of fluorine atoms at the surface with Ra (AFM) being at least 3.0 nm of the fluororesin film after plasma treatment, is preferably at most 65% to the total of the three elements of carbon atoms, fluorine atoms and oxygen atoms. When the composition ratio of fluorine atoms is in the above range, it is easy to impart good adhesion. Further, when the composition ratio of fluorine atoms is at least 25%, the electrical characteristics as a printed circuit board becomes high.

[Laminate]

The laminate of the present invention is a laminate having a layer A made of a material containing said fluororesin F, and a layer B made of a material not containing the fluororesin F, of which at least one side is made of a surface of said layer A, wherein at least one of surfaces of the layer A of the laminate is a surface with Ra (AFM) being at least 3.0 nm. The surface with Ra (AFM) being at least 3.0 nm of the layer (A) is further preferably that Rz (AFM) is at least 80.0 nm. The laminate of the present invention is particularly effective as a laminate for laminating an object to be laminated on the layer A surface by hot pressing.

The lamination structure of the laminate of the present invention has a lamination structure in which at least one layer A becomes the outermost layer. The lamination structure of the laminate of the present invention may, for example, be a structure having the layer A and the layer B laminated in this order (referred to also as layer A/layer B; the same applies also with respect to other lamination structures), or layer A/layer B/layer A.

The material constituting the layer A is a material containing the fluororesin F, and is preferably made of a material which constitutes the fluororesin film of the present invention. The material constituting the layer A may consist solely of the fluororesin F, and as the fluororesin F in such a case, may be a fluororesin F2 having no adhesive functional group, such as PTFE.

The layer A may be a layer made of a fluororesin film of the present invention, or a fluororesin layer which is formed by e.g. coating from a resin powder containing a fluororesin F. The layer A may be a single layer, or may be a multi-layer made of two or more layers.

In a case where both sides of the laminate of the present invention are the surfaces of layer A, only one side may be a surface with Ra (AFM) being at least 3.0 nm, or both sides may be surfaces with Ra (AFM) being at least 3.0 nm. The preferred ranges of the thickness and dielectric constant of the layer A having a surface with Ra (AFM) being at least 3.0 nm, are the same as the respective preferred ranges of the fluororesin film. In a case where the laminate of the present invention has a second layer A having a surface with Ra (AFM) being not at least 3.0 nm, the preferred ranges of the thickness and dielectric constant of the second layer A are also preferably the same as the respective preferred ranges of the fluororesin film.

Here, the same applies in a case where said "Ra (AFM) being at least 3.0 nm" is replaced by "Ra (AFM) being at least 3.0 nm and Rz (AFM) being at least 80.0 nm".

The material constituting the layer B is a material that does not contain the fluororesin F, and may be a resin material such as a fluororesin other than the fluororesin F, a thermoplastic resin having no fluorine atom or a thermosetting resin having no fluorine atom. Further, it may be an inorganic material such as metal or glass, or a combination material of an inorganic material and a resin material (a prepreg, etc. as described later). A metal is particularly preferred as the material constituting the layer B.

The layer B is preferably made of a substrate made of the above-mentioned material. For example, a film made of said resin material, a film made of said inorganic material, a film consisting of a combination of such films, or a substrate made of a molded product other than a film, may be mentioned. Particularly, a substrate made of a metal film so called a metal foil, or a film-shaped substrate made of a thin layer made of a metal and a resin material layer, is preferred, and in the following, such a substrate will be referred to as a metal substrate.

The layer B may be a single layer, or may be a multi-layer made of two or more layers. Further, the layer B may contain a filler, and, for example, may contain a fluororesin powder. As the layer B, a layer made of a metal substrate is useful for an application to a printed circuit board.

The metal substrate may, for example, be a metal foil, a resin film having a metal plating layer on its surface, or a resin film having a metal vapor deposition layer on its surface (a metal vapor deposited resin film).

The metal constituting the metal substrate may be iron, stainless steel, aluminum, copper, brass, nickel, zinc, titanium, or an alloy of these metals. For an application to a printed circuit board, copper or a copper alloy, stainless steel, nickel or a nickel alloy (including 42 alloy), or aluminum or an aluminum alloy, is preferred; and copper is particularly preferred. As the metal substrate, a copper foil such as a rolled copper foil or an electrolytic copper foil, is particularly preferred.

On the surface of the metal substrate, an anticorrosive layer (e.g. an oxide covering film such as a chromate) or a heat-resistant layer may be formed. Further, in order to improve the adhesion to the layer A, a coupling agent treatment or the like may be applied on the surface of the metal substrate.

The thickness of the metal substrate is not particularly limited, and depending on the application, the thickness may be selected so that sufficient functions can be exhibited.

As the metal vapor deposited resin film, a film may be mentioned in which the above-mentioned metal is vapor-deposited on one side or both sides of a heat-resistant resin film by a vapor deposition method such as a vacuum vapor deposition method, a sputtering method or an ion plating method.

As the resin film as a substrate to be used for the layer B, a heat-resistant resin film, or a thermosetting resin film is preferred.

The heat-resistant resin film is a film containing at least one type of heat-resistant resin. However, the heat-resistant resin film does not contain a fluororesin. The heat-resistant resin film may be a monolayer film or may be a multilayer film.

The heat-resistant resin means a polymer compound having a melting point of at least 280° C., or a polymer compound having a maximum continuous use temperature of at least 121° C. as defined in JIS C4003: 2010 (IEC 60085: 2007).

As the heat-resistant resin, a polyimide (an aromatic polyimide, etc.), a polyarylate, a polysulfone, a polyallyl sulfone (a polyether sulfone, etc.), an aromatic polyamide, an aromatic polyether amide, a polyphenylene sulfide, a polyaryl ether ketone, a polyamideimide, or a liquid crystal polymer (hereinafter referred to also as "LCP") such as a liquid crystal polyester, may be mentioned.

LCP is a thermoplastic polymer capable of forming a melt phase with an optical anisotropy. An optical anisotropy during melting can be confirmed, for example, by placing a sample on a hot stage, heating it to raise the temperature in a nitrogen atmosphere, and observing the transmitted light through the sample.

An example of LCP may be a thermoplastic liquid crystal polyester or a thermoplastic liquid crystal polyester amide having an amide bond introduced to such a polyester.

Further, it may be a polymer having an imide bond, a carbonate bond, a carbodiimide bond or a bond derived from isocyanate such as an isocyanurate bond further introduced to an aromatic polyester or an aromatic polyester amide. In particular, a thermoplastic liquid crystal polyester is preferred.

The melting point of LCP is preferably from 280 to 360° C., more preferably from 290 to 350° C.

Examples of LCP may be VECSTAR (manufactured by Kuraray Co., Ltd., trade name), BIAC (manufactured by Japan Gore Co., Ltd., trade name), "LAPEROS" manufactured by Polyplastics Co., Ltd., "VECTRA" manufactured by Celanese Corp., "UENOLCP" manufactured by Ueno Fine Chemicals Industry Co., Ltd., "Sumika Super LCP" manufactured by Sumitomo Chemical Co., Ltd, "XYDAR" manufactured by SOLVAY SPECIALTY POLYMERS, "XYDAR" manufactured by JX Nippon Oil & Energy Corporation, "SIVERAS" manufactured by Toray Industries, Inc., etc.

As the heat-resistant resin film, a polyimide film or a liquid crystal polyester film is preferred, and from the viewpoint of electrical characteristics, a liquid crystal polyester film is more preferred. On the surface on the layer A side of the heat-resistant resin film, surface treatment such as corona treatment or plasma treatment may be applied.

The thermosetting resin film may be a monolayer film or may be a multilayer film. The thermosetting resin constituting the thermosetting resin film may be the same as the thermosetting resin mentioned in the description of the liquid composition. The thermosetting resin to be used for the layer B is a thermosetting resin (hereinafter referred to also as a "thermosetting resin H") which is capable of forming the layer B at a temperature of at most the melting point of the fluororesin F.

As the resin to constitute the resin film, a polyolefin (polyethylene, polypropylene, etc.), a polyester (polyethylene terephthalate, polyethylene naphthalate, etc.), a polyphenylene ether, etc. may be used.

The ratio A/B of the thickness of the layer A to the thickness of the layer B in the laminate of the layer A containing the fluororesin F and the layer B containing the thermosetting resin H, is preferably at least 0.3 and at most 3.0. When the ratio A/B in thickness is at least 0.3, the effect to lower the dielectric constant is high. When the ratio A/B in thickness is at most 3.0, the linear expansion coefficient becomes small.

In a case where the layer A and the layer B containing a thermosetting resin H are laminated directly in the laminate, the peel strength at the interface between the layer A and the layer B is preferably at least 5N/10 mm, more preferably at least 7N/10 mm, further preferably at least 8N/10 mm.

The dielectric constant (20 GHz) of the laminate containing the layer B containing the thermosetting resin H is preferably less than 3.6, more preferably at most 3.55, particularly preferably at most 3.20. As the dielectric constant (20 GHz) of the laminate is lower, it is possible to obtain an excellent transmission efficiency in a case where the laminate is used as a substrate of a printed circuit board.

The dielectric loss tangent (20 GHz) of the laminate containing the layer B containing the thermosetting resin H is preferably at most 0.01, more preferably at most 0.007, particularly preferably at most 0.005. As the dielectric constant (20 GHz) of the laminate is lower, it is possible to obtain an excellent transmission efficiency in a case where the laminate is used as a substrate of a printed circuit board.

As a preferred laminate, a laminate may be mentioned wherein the layer B contains a thermosetting resin H, a structure having the layer A and the layer B directly laminated is contained, the peel strength at the interface between the directly laminated layers A and B is at least 5N/10 mm, and the dielectric constant (20 GHz) is less than 3.6. In this case, it is more preferred that at the surface of the layer A in contact with the layer B, the composition ratio of oxygen atoms is at least 1% to the total of the three elements of carbon atoms, fluorine atoms and oxygen atoms, and the composition ratio of fluorine atoms is at least 25% and at most 65%.

A specific example of the laminate of the present invention may, for example, be a laminate 1 illustrated in FIG. 1. The laminate 1 is provided with a layer A10 and a layer B12 laminated on the first surface 10a side in the thickness direction of the layer A10.

In the laminate 1, Ra (AFM) of the second surface 10b on the opposite side to the layer B12, of the layer A10, is made to be at least 3.0 nm. It is thereby possible to obtain an excellent interlayer adhesion at the time when an object to be laminated is laminated on the second surface 10b side of the layer A10 of the laminate 1.

In the laminate 1, further Ra (AFM) of the first surface 10a of the layer A10 may be made to be at least 3.0 nm. In a case where the layer B12 is a glass member or a resin film, from the viewpoint of interlayer adhesion of the layer A10 and the layer B12, it is preferred that Ra (AFM) of the first surface 10a is made to be at least 3.0 nm. In a case where the layer B12 is a metal layer, it is possible to obtain sufficient interlayer adhesion between the layer A10 and the layer B12, even if Ra (AFM) of the first surface 10a is not at least 3.0 nm.

Figure 2:
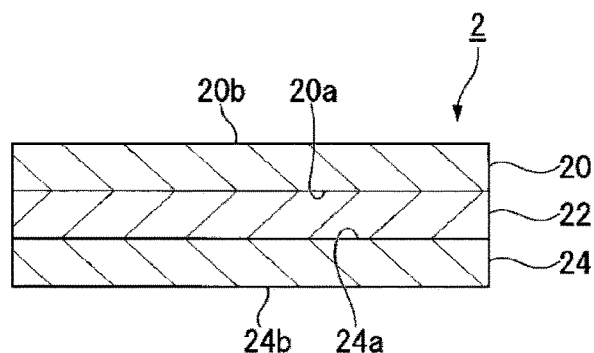
FIG. 2 is a cross-sectional view showing another example of the laminate of the present invention.

The laminate of the present invention may be a laminate 2 illustrated in FIG. 2. The laminate 2 is provided with a first layer A20, a layer B22 laminated on the first surface 20a side in the thickness direction of the first layer A20, and a second layer A24 laminated on the opposite side to the first layer A20 of the layer B22.

In the laminate 2, Ra (AFM) of the second surface 20b on the opposite side to the layer B22 of the first layer A20 is made to be at least 3.0 m and further, Ra (AFM) of the second surface 24b on the opposite to the layer B22 of the second layer A24 is made to be at least 3.0 nm. It is thereby possible to obtain excellent interlayer adhesion at the time when an object to be laminated, is laminated on the second surface 20b side of the first layer A20 of the laminate 2, and on the second surface 24b side of the second layer A24. Here, in the laminate 2, further Ra (AFM) of the first surface 20a of the first layer A20 and the first surface 24a of the second layer A24 may be made to be at least 3.0 nm.

Here, the same applies in a case where in the above embodiments of the laminate, "Ra (AFM) being at least 3.0 nm" is replaced by "Ra (AFM) being at least 3.0 nm, and Rz (AFM) being at least 80.0 nm".

The present invention can provide laminates of the various modes. The present invention can provide a laminate which comprises a layer A containing a fluororesin having a melting point of from 260 to 380° C. and a layer B made of another substrate other than the layer A, and which includes a structure having the layer A and the layer B directly laminated, wherein the peel strength at the interface between the directly laminated layers A and B is at least 5N/10 mm, and the dielectric constant (20 GHz) is less than 3.6. In this case, the material for forming the layer B is preferably a thermosetting resin to form the above layer B at a temperature of at most the melting point the above fluororesin, or a prepreg which will be described later, particularly preferably a prepreg which will be described later. Such a laminate can be obtained in a low temperature region of at most the melting point of the fluororesin and thus is excellent in the electrical characteristics such as the dielectric constant, etc.

(Method for Producing the Laminate)

As the method for producing the laminate of the present invention, a method is preferred in which after producing a laminate having a layer A containing a fluororesin F, and a layer B, the surface of the layer A of the obtained laminate, is surface-treated so that Ra (AFM) becomes to be at least 3.0 nm.

The method for producing a laminate having the layer A and the layer B, is preferably a method of applying a resin powder containing a fluororesin F on the surface of a substrate to become the layer B to form the layer A on the substrate to become the layer B. In this case, the method may be a method of applying the above-mentioned dispersion or liquid composition to form a film by a gravure coating method, a micro gravure coating method, a gravure offset method, a knife coating method, a kiss coating method, a bar coating method, a die coating method, a fountain Mayer bar method, a slot die coating method, or the like, or a resin powder may be powder-coated on the surface of a substrate to become the layer B by an electrostatic coating method or the like.

As a method for surface treatment to make the layer A surface of the laminate to have Ra (AFM) being at least 3.0 nm, the same method as the method described in the method for producing the fluororesin film may be mentioned.

Otherwise, it is also possible to produce a laminate of the present invention by producing a laminate by laminating a fluororesin film, of which Ra (AFM) of its surface is not at least 3.0 nm (i.e. not the above-mentioned fluororesin film of the present invention in that Ra (AFM) of the surface is different) on a substrate to become the layer B, and surface-treating the surface of the fluororesin film of the obtained laminate so that Ra (AFM) becomes to be at least 3.0 nm.

Further, the fluororesin film of the present invention may be laminated on a substrate to become the layer B, to obtain a laminate. For example, a method may be mentioned in which a fluororesin film, of which Ra (AFM) of at least one surface is at least 3.0 nm, is laminated on a substrate to become the layer B, to obtain a laminate so that the surface with Ra (AFM) being at least 3.0 nm, becomes the surface of the laminate. Otherwise, after laminating a substrate to become the layer B on a surface of the fluororesin film, of which only said surface has Ra (AFM) being at least 3.0 nm, the surface of the fluororesin F layer of the obtained laminate may be surface-treated so that Ra (AFM) becomes to be at least 3.0 nm.

Here, the same applies in a case where in the above production method of the laminate, "Ra (AFM) being at least 3.0 nm" is replaced by "Ra (AFM) being at least 3.0 nm, and Rz (AFM) being at least 80.0 nm".

A laminate having a copper foil layer as the layer B may be produced by using copper foil as the substrate, applying the liquid composition on one side of the copper foil to form a film of the liquid composition, then removing the liquid medium by heating and drying, and continuously heating to melt the resin powder, followed by cooling to form a layer A being a uniform resin layer with no unmelted particles. It is also possible to form the resin layer on both surfaces of the copper foil as described above.

The maximum height Rz of the surface roughness to be measured based on JIS C6515: 1998 (IEC61249-5-1 1995), of the copper foil to be used, is preferably at least 1 nm and at most 2.5 µm. In consideration of the electrical characteristics, a copper foil with a small surface roughness is preferred. The fluororesin film of the present invention can be laminated also on a copper foil with a small surface roughness.

The formation of a film of the liquid composition, the heat drying and the melting of the resin powder, can be carried out under the above-described conditions. For example, in a case where the heating after drying is conducted by heating by a hot roll, a laminate of the unmelted resin layer and the copper foil after drying is brought into contact with the hot roll and transported while being irradiated with far infrared, whereby the unmelted resin layer can be made to be a molten resin layer. The conveying speed of the roll is not particularly limited, but is, for example, preferably from 4.7 m/min to 0.31 m/min in the case of using a heating furnace with a length of 4.7 m. In the case of using a heating furnace with a length of 2.45 m in order to efficiently heat the entire film in a further short time, the conveying speed may be made to be from 4.7 m/min to 2.45 m/min.

The heating temperature is not particularly limited, but when the residence time in the heating furnace is set to be 1 minute, the heating temperature is preferably from 330° C. to 380° C., more preferably from 350° C. to 370° C. It is also possible to lower the temperature by increasing the residence time.

The thickness of the layer A of the laminate to be produced, is preferably at most 15 µm, more preferably at most 10 µm, particularly preferably at most 8 µm. However, from the viewpoint of electrical characteristics, it is preferably at least 1 µm. When the thickness is at most the upper limit value in the above range, even in the case of an asymmetric layer structure of the resin layer (layer A)/the copper foil (layer B), it is possible to suppress warpage. The warpage rate of the laminate is preferably at most 25%, more preferably at most 15%, further preferably at most 10%, particularly preferably at most 7%. When the warpage rate is at most the upper limit value, the handling efficiency will be excellent in the molding process at the time of processing into a printed circuit board, and the dielectric properties as a printed circuit board will be excellent.

Further, it is possible to further suppress the warpage by using a liquid composition containing a filler such as silica or PTFE, or a liquid composition containing a fluororesin such as a TFE/PAVE copolymer, a TFE/HFP copolymer or PCTFE, as the fluororesin F (but excluding the fluorinated polymer F11). The thickness of the layer A of the laminate containing said filler is preferably at most 200 µm, more preferably at most 100 µm, particularly preferably at most 50 µm. However, from the viewpoint of the electrical characteristics, it is preferably at least 1 µm.

As a method of laminating the fluororesin film of the present invention on the surface of the substrate to become the layer B, a method by hot pressing may be mentioned. The temperature for the hot pressing at the time of laminating the fluororesin film on the surface of the substrate to become the layer B is preferably at most the melting point of the fluororesin F, more preferably from 140 to 250° C. It becomes possible to conduct the hot pressing at the melting point of the substrate to become the layer B, which is lower than the melting point of the fluororesin F.

However, in the case of a substrate to become the layer B, having a melting point higher than the fluororesin F, like a liquid crystal polymer, it is also possible to conduct hot pressing at a temperature lower by at least 5 degrees than the melting point of the substrate to become the layer B.

[Method for Producing Hot Pressed Laminate]

The method for producing a hot pressed laminate of the present invention is a method of bonding by hot pressing an object to be laminated, on a surface with Ra (AFM) being at least 3.0 nm of the fluororesin film of the present invention or of the laminate of the present invention.

Further, it is also possible to produce a hot pressed laminate in the same manner in a case where said "surface with Ra (AFM) being at least 3.0 nm" is replaced by a "surface with Ra (AFM) being at least 3.0 nm and Rz (AFM) being at least 80.0 nm".

The object to be laminated, may, for example, be a prepreg, a glass member or a ceramic member. Among them, the present invention is effective in the case of using a prepreg as the object to be laminated.

As the prepreg, one having a matrix resin impregnated in a reinforcing fiber sheet, may be mentioned.

The reinforcing fiber sheet may be a reinforcing fiber bundle composed of a plurality of reinforcing fibers, a cloth made by weaving said reinforcing fiber bundle, a unidirectional reinforcing fiber bundle having a plurality of reinforcing fibers aligned in one direction, a unidirectional cloth composed of said unidirectional reinforcing fiber bundle, a combination thereof, a laminate of a plurality of reinforcing fiber bundles, etc.

The reinforcing fibers are preferably continuous long fibers having a length of at least 10 mm. The reinforcing fibers need not be continuous over the entire length in the longitudinal direction or over the entire width in the width direction, of the reinforcing fiber sheet, and they may be divided in the middle.

The reinforcing fibers may be inorganic fibers, metal fibers, organic fibers, etc.

The inorganic fibers may be carbon fibers, graphite fibers, glass fibers, silicon carbide fibers, silicon nitride fibers, alumina fibers, silicon carbide fibers, boron fibers, etc.

The metal fibers may be aluminum fibers, brass fibers, stainless steel fibers, etc.

The organic fibers may be aromatic polyamide fibers, polyaramide fibers, polyparaphenylene benzoxazole (PBO) fibers, polyphenylene sulfide fibers, polyester fibers, acrylic fibers, nylon fibers, polyethylene fibers, etc.

The reinforcing fibers may be ones having surface treatment applied.

As the reinforcing fibers, one type may be used alone, or two or more types may be used in combination.

In an application to a printed circuit board, glass fibers are preferred as the reinforcing fibers.

The matrix resin may be a thermoplastic resin or may be a thermosetting resin. The present invention is particularly effective in the case of using, as the matrix resin, a thermoplastic resin having a melting point of at most 280° C. or a thermosetting resin having a thermosetting temperature of at most 280° C. As the matrix resin, one type may be used alone, or two or more types may be used in combination.

The matrix resin of the prepreg is preferably at least one member selected from the group consisting of an epoxy resin, a polyphenylene oxide, a polyphenylene ether and a polybutadiene.

As the matrix resin, a thermosetting resin is preferred. The thermosetting resin may be the same as the thermosetting resin mentioned in the description of the liquid composition. The thermosetting resin is preferably at least one member selected from the group consisting of an epoxy resin, a polyphenylene oxide, a polyphenylene ether and a polybutadiene.

The thermoplastic resin may be a polyester-type resin (such as polyethylene terephthalate), a polyolefin-type resin (such as polyethylene), a styrene-type resin (such as polystyrene), a polycarbonate, a polyimide (such as an aromatic polyimide), a polyarylate, a polysulfone, a polyallyl sulfone (such as polyether sulfone), an aromatic polyamide, an aromatic polyether amide, a polyphenylene sulfide, a polyaryl ether ketone, a polyamideimide, a liquid crystal polyester, a polyphenylene ether, a fluororesin such as PTFE, a TFE/PAVE copolymer, a TFE/HFP copolymer or PCTFE, etc.

In a case where the matrix resin is a thermosetting resin, the curing temperature of the thermosetting resin is preferably at most the melting point of the fluororesin, particularly preferably from 120 to 300° C.

The thickness of the prepreg is preferably at least 10 μm and at most 5 mm, more preferably at least 30 μm and at most 3 mm, particularly preferably at least 80 μm and at most 1 mm. However, the thickness of the prepreg can be suitably set depending on the substrate.

As the prepreg, ones having the following trade names may be mentioned.

As manufactured by Panasonic Corporation, R-G520, R-1410 W, R-1410A and R-1410E in MEGTRON GX series, R-1410 W, R-1410A and R-1410E in MEGTRON series, R-5680, R-5680 (J), R-5680 (NJ), R-5670, R-5670 (N), R-5620S, R-5620, R-5630 and R-1570 in MEGTRON series, R-1650V, R-1650D, R-1650M, R-1650E, R-5610, CR-5680, CR-5680 (N) and CR-5680 (J) in HIPER series.

As manufactured by Hitachi Chemical Co., Ltd., GEA-770G GEA-705G, GEA-700G, GEA-679F GEA-679F (R), GEA-78G, TD-002, GEA-75G, GEA-67, and GEA-67G.

EI-6765 manufactured by Sumitomo Bakelite Co., Ltd., and R-5785 manufactured by Panasonic Corporation.

As manufactured by Mitsubishi Gas Chemical Co., Ltd., GEPL-190T, GEPL-230T, GHPL-830X Type A, GHPL-830NS, GHPL-830NSR, and GHPL-830NSF.

As manufactured by DOOSAN CORPORATION, GEPL-190T, GEPL-230T, GHPL-830X Type A, GHPL-830NS, GHPL-830NSR, and GHPL-830NSF.

As manufactured by GUANDONG Shengyi SCI. TECH, SP120N, S1151G, S1151 GB, S1170G, S1170 GB, S115 S1150 GB, S1140F, S1140FB, S7045G, SP175M, S1190, S1190B, 81170, S0701, S1141KF, S0401KF, S1000-2M, S1000-2 MB, S1000-2, S1000-2B, S1000, S1000B, S1000H, S1000HB, S7136H, S7439, and S7439B.

As manufactured by SHANGHAI NANYA, NY1135, NY1140, NY1150, NY1170, NY2150, NY2170, NY9135, NY9140, NY9600, NY9250, NY9140 HF, NY6200, NY6150, NY3170 LK, NY6300, NY3170M, NY6200, NY3150 HF CTI600, NY3170HF, NY3150D, NY3150HF, NY2170H, NY2170, NY2150, NY2140, NY1600, NY1140, NY9815HF, NY9810HF, NY9815 and NY9810.

As manufactured by ITEQ CORPORATION, IT-180GN, IT-1801, IT-180A, IT-189, IT-180, IT-258GA3, IT-158, IT-150GN, IT-140, IT-150GS, IT-150G, IT-168G1, IT-168G2, IT-170G, IT-170GRA1, IT-958G, IT-200LK, IT-200D, IT-150DA, IT-170GLE, IT-968G, IT-968G SE, IT-968 and IT-968 SE.

As manufactured by NANYA PLASTICS, UV BLOCK FR-4-86, NP-140 TL/B, NP-140M TL/B, NP-150 R/TL/B, NP-170 R/TUB, NP-180 R/TUB, NPG R/TL/B, NPG-151, NPG-150N, NPG-150LKHD, NPG-170N, NPG-170 R/TUB, NPG-171, NPG-170D R/TL/B, NPG-1801D/B, NPG-1801F/B, NPG-1801N/B, NPG-1801NBK/B(BP), NPG-186, NPG-200R/TL, NPG-200WT, FR-4-86 PY, FR-140TL PY, NPG-PY R/TL, CEM-3-92, CEM-3-92PY, CEM-3-98, CEM-3-01 PY, CEM-3-01 HC, CEM-3-09, CEM-3-09HT, CEM-3-10, NP-LDII, NP-LDIII, NP-175R/TL/B, NP-155F R/TL/B, NP-175F R/TUB, NP-175F BH and NP-175FM BH.

As manufactured by TAIWAN UNION ECHNOLOGY, ULVP series, and LDP series.

As manufactured by ISOLA GROUP, A11, R406N, P25N, TerraGreen, I-Tera MT40, IS680 AG, IS680, Astra MT77, G200, DE104, FR408, ED130UV, FR406, IS410, FR402, FR406N, IS420, IS620i, 370TURBO, 254, I-Speed, FR-408HR, IS415 and 370HR.

As manufactured by PARK ELECTROCHEMICAL, NY9000, NX9000, NL9000, NH9000, N9000-13 RF, N8000Q, N8000, N7000-1, N7000-2 HT slash-3, N7000-3, N5000, N5000-30, N-5000-32, N4000-12, N4000-12SI, N4000-13, N4000-13SI, N4000-13SI, N4000-13EP, N4000-13EP SI, N4350-13RF, N4380-13RF, N4800-20, N4800-20SI, Meteorwave 1000, Meteorwave 2000, Meteorwave 3000, Meteorwave 4000, Mercurywave 9350, N4000-6, N4000-6FC, N4000-7, N4000-7SI, N4000-11 and N4000-29.

As manufactured by ROGERS CORPORATION, RO4450B, RO4450F, CLTE-P, 3001 Bonding Film, 2929 Bondply, CuClad 6700 Bonding Film, ULTRALAM 3908 Bondply and CuClad 6250 Bonding Film.

As manufactured by Toshimasa Industries, Ltd., ES-3329, ES-3317B, ES-3346, ES-3308S, ES-3310A, ES-3306S, ES-3350, ES-3352, ES-3660, ES-3351S, ES-3551S, ES-3382S, ES-3940, ES-3960V, ES-3960C, ES-3753, ES-3305, ES-3615, ES-3306S, ES-3506S, ES-3308S, ES-3317B and ES-3615.

The construction of the hot pressed laminate is not particularly limited, but a metal layer (layer B)/resin layer (layer A)/object to be laminated/resin layer (layer A)/metal layer (layer B), a metal layer/object to be laminated/resin layer (fluororesin film)/object to be laminated/metal layer, etc. may be mentioned. For example, it may be a construction of a metal layer (layer B)/resin layer (layer A)/object to be laminated/resin layer (layer A)/metal layer (layer B) including a resin layer containing a fluororesin F (e.g. a fluororesin F1 alone, or a mixture of a fluororesin F1 and a fluororesin F2) and an object to be laminated, containing a fluororesin F (e.g. a fluororesin F1 alone, a mixture of a fluororesin F1 and a fluororesin F2, or a fluororesin F2 alone), and further, the respective layers may contain a glass cloth or a filler.

The thickness of the above resin layer is preferably at most 15 μm, more preferably at most 10 μm, particularly preferably at most 8 μm. However, from the viewpoint of the electrical characteristics, it is preferably at least 1 μm. Further, it is possible to further suppress the warpage by using a liquid composition containing a filler such as silica and PTFE, or a liquid composition containing, as a fluororesin F, a TFE/PAVE copolymer, a TFE/HFP copolymer or another fluororesin such as polychlorotrifluoroethylene.

The thickness of the above resin layer of the heat pressed laminate wherein the above resin layer contains a filler, is preferably at most 200 μm, more preferably at most 100 μm, particularly preferably at most 50 μm. However, from the viewpoint of the electrical characteristics, it is preferably at least 1 μm.

The thickness of the above object to be laminated, is preferably from 0.1 to 500 μm, more preferably from 0.3 to 300 μm, further preferably from 0.5 to 150 μm. When it is at most the upper limit value in the above range, the drilling processability will be good, and the dielectric properties will be excellent.

The temperature for the hot pressing the fluororesin film or laminate and the prepreg, is preferably at most the melting point of the fluororesin F, more preferably from 120 to 300° C., further preferably from 140 to 240° C., still more preferably from 160 to 220° C. When the hot pressing temperature is within the above range, while suppressing the thermal deterioration of the object to be laminated, it is possible to laminate the fluororesin film or laminate and the object to be laminated with excellent interlayer adhesion.

Further, in a case where the object to be laminated is made of a thermoplastic resin, and the thermoplastic resin contains at least 50 mass % of any of a polyimide (an aromatic polyimide or the like), a liquid crystal polyester, PTFE, a TFE/PAVE copolymer, a TFE/HFP copolymer and polychlorotrifluoroethylene, or in a case where the object to be laminated, contains at least 50 mass % of the above thermoplastic resin, the temperature for the hot pressing is preferably from 310 to 400° C., more preferably from 320 to 380° C., further preferably from 330 to 370° C. When the hot pressing temperature is within the above range, while suppressing the thermal deterioration of the object to be laminated, it is possible to laminate the fluororesin film or laminate and the object to be laminated, with excellent interlayer adhesion.

The layer A of the fluororesin film or laminate in the hot pressed laminate may contain a filler or reinforcing fibers. Further, the object to be laminated, may contain a filler, reinforcing fibers or a fluorinated polymer F11.

The peel strength at the interface between the fluororesin film or laminate and the object to be laminated, in the hot pressed laminate, is preferably at least 5N/10 mm, more preferably at least 7N/10 mm, further preferably at least 8N/10 mm.

The dielectric constant (20 GHz) of the hot pressed laminate in the case of using the thermosetting resin H for the layer B, is preferably less than 3.6, more preferably at most 3.55, particularly preferably at most 3.20. The lower the dielectric constant (20 GHz) of the hot pressed laminate, the better the transmission efficiency, when the hot pressed laminate is used for a substrate of a printed circuit board.

The dielectric loss tangent (20 GHz) of the hot pressed laminate in the case of using the thermosetting resin H for the layer B, is preferably at most 0.01, more preferably at most 0.007, particularly preferably at most 0.005. The lower the dielectric constant (20 GHz) of the hot pressed laminate, the better the transmission efficiency when the hot pressed laminate is used for a substrate of a printed circuit board.

From S-parameter (90 GHz) values obtainable by the transmission loss evaluation of the hot pressed laminate, when the laminate containing no fluororesin film is taken as 1, the rate of change of the laminate containing the fluororesin film, is preferably at least 3%, more preferably at least 5%, further preferably at least 10%. When said hot pressed laminate is used for a substrate of a printed circuit board, excellent transmission efficiency will be obtained.

In a case where the surface of the fluororesin film containing a fluororesin F is surface-treated so that Ra (AFM) becomes to be at least 3.0 nm, the wetting tension of the surface becomes at least 30 mN/n. Therefore, it is possible to similarly produce a hot pressed laminate excellent in interlayer adhesion also by surface-treating a fluororesin film containing the fluororesin F, to obtain a fluororesin film, of which the wetting tension of at least one surface in the thickness direction is at least 30 mN/m, and bonding an object to be laminated, to the surface with the wetting tension being at least 30 mN/m, of the obtained fluororesin film, by hot pressing at a temperature of at most the melting point of the fluororesin F.

[Method for Producing Printed Circuit Board]

The method for producing a printed circuit board of the present invention is a method which comprises producing a hot pressed laminate with a layer B being a metal layer, and etching the metal layer to form a patterned circuit to obtain a printed circuit board. For the etching of the metal layer, a known method may be employed.

In the method for producing a printed circuit board of the present invention, after forming the patterned circuit by etching the metal layer, an interlayer insulating film may be formed on the pattern circuit, and a patterned circuit may further be formed on the interlayer insulating film. The interlayer insulating film may be formed, for example, by the above-described liquid composition. Specifically, for example, the following method may be mentioned. After forming the patterned circuit by etching the metal layer of a metal laminate with an optional laminated structure, the liquid composition is applied on the patterned circuit, and dried, followed by heating to obtain an interlayer insulating film. Then, a metal layer is formed by e.g. vapor deposition or the like on the interlayer insulating film, followed by etching to form a further patterned circuit.

In the production of a printed circuit board, a solder resist may be laminated on the patterned circuit. The solder resist may be formed, for example, by the above-described liquid composition. Specifically, the liquid composition may be applied on the patterned circuit and dried, followed by heating to form a solder resist.

In the production of a printed circuit board, a coverlay film may be laminated. The coverlay film is typically composed of a substrate film and an adhesive layer formed on its surface, and the surface on the adhesive layer side is bonded to the printed circuit board. As the substrate film of the cover lay film, for example, a fluororesin film of the present invention may be used. Further, on a patterned circuit formed by etching a metal layer, an interlayer insulating film (adhesive layer) using a fluororesin film of the present invention may be formed, and a polyimide film may be laminated as a coverlay film.

A printed circuit board obtainable by the production method of the present invention is useful as a substrate for electronic devices such as radars, network routers, backplanes, wireless infrastructures, for which frequency characteristics are required, as a substrate for various sensors for automobiles, or as a substrate for an engine management sensor, and it is particularly suitable for an application intended to reduce the transmission loss in the millimeter wave band.

As described above, in the present invention, a fluororesin F excellent in heat resistance such that the melting point is from 260 to 380° C., is used. Further, Ra (AFM) of the surface of the layer A of the fluororesin film or the laminate, is made to be at least 3.0 nm, whereby even if an object to be laminated, is laminated on the surface by hot pressing at a temperature of at most the melting point of the adhesive fluororesin, excellent interlayer adhesion is obtainable.

In the present invention, the contributory factor which makes the interlayer adhesion excellent between the object to be laminated, and the surface with Ra (AFM) being at least 3.0 nm, of the layer A of the fluororesin film or the laminate, is not necessarily clear, but is considered as follows. Since Ra (AFM) is at least 3.0 nm, not only an anchor effect at the bonding interface is obtainable, but also the surface area of the bonding surface with the object to be laminated, of the fluororesin film or layer A increases, and along therewith, the density of adhesive functional groups increases.

Here, the same applies in the case where "Ra (AFM) being at least 3.0 nm" is replaced by "Ra (AFM) being at least 3.0 nm and Rz (AFM) being at least 80.0 nm".

EXAMPLES

Hereinafter, the present invention will be specifically described with reference to Examples, but the present invention is not limited by the following description.

[Measurement Methods]
(1) Copolymerization Composition of Fluorinated Polymer

The proportion (mol %) of units derived from NAH was obtained by converting the absorbance of the absorption peak of the units appearing at 1,778 $cm^{-1}$ in the infrared absorption spectrum of the press-molded product (film with a thickness of 200 μm) of a fluorinated polymer by using the molar absorbance coefficient 20,810 $mol^{-1} \cdot cm^{-1}$ of NAH.

The proportions of other units were obtained by the melt NMR analysis and the fluorine content analysis.

(2) Melting Point (° C.) of Fluorinated Polymer

Using a differential scanning calorimeter (DSC apparatus) manufactured by Seiko Denshi, the melting peak at the time of heating a fluorinated polymer at a temperature raising rate of 10° C./min was recorded, and the temperature (° C.), corresponding to the maximum value was taken as the melting point (Tm).

(3) MFR (g/10 Min) of Fluorinated Polymer

Using a melt indexer manufactured by Techno Seven Co., Ltd., the mass (g) of a fluorinated polymer flowing out for 10 minutes (unit time) from a nozzle having a diameter of 2 mm and a length of 8 mm at 372° C. under a load of 49 N, was measured and adopted as MFR.

(4) D50 and D90 of Resin Powder

Using a laser diffraction and diffusion particle size distribution measuring apparatus (LA-920 instrument) manufactured by Horiba Ltd., a resin powder was dispersed in water, and the particle size distribution was measured, whereupon D50 (μm) and D90 (μm) were calculated.

(5) Loosely Packing Bulk Density and Densely Packing Bulk Density

The loosely packing bulk density and the densely packing bulk density of a resin powder were measured by using the methods as described in [0117] and [0118] of WO2016/017801.

(6) Dielectric Constant and Dielectric Loss Tangent

The dielectric constant (1 MHz) of the material in Production Example 1 was obtained at 1 MHz by a breakdown test equipment (YSY-243-100RHO (manufactured by Yamayo Tester Co.)) by a transformer bridge method in accordance with ASTM D150 in such a test environment that the temperature was within a range of 23° C.±2° C., and the relative humidity was maintained within a range of 50±5% RH.

The dielectric constant (20 GHz) and dielectric loss tangent (20 GHz) of other materials were obtained by the SPDR method of QWED Co. at a frequency of 20 GHz under an environment of 23° C.±2° C. within a range of 50±5% RH.

(7) Arithmetic Average Roughness

Ra of the surface of the layer (A-1) of a single-sided copper clad laminate was measured based on JIS B0601: 2013 (ISO4287: 1997, Amd. 1: 2009). At the time of obtaining Ra, the standard length lr (cut-off value λc) for the roughness curve was set to be 0.8 mm.

(8) Peel Strength at the Interface Between Layer (A-1) and Prepreg

The layer (A-1) and the prepreg were peeled from one end in the length direction of a hot pressed laminate cut out in a rectangular shape (length: 100 mm, width: 10 mm), to a position of 50 mm, and then, by setting the same position as the center, they were peeled at 90 degrees at a tensile speed of 50 mm/min pulling, whereby the maximum load was adopted as the peel strength (N/10 mm). The larger the peel strength, the better the interlayer adhesion between the layer (A-1) and the prepreg.

(9) Ra (AFM) and Rz (AFM)

By using AFM manufactured by Oxford Instruments, Inc., Ra (AFM) and Rz (AFM) of the surface within a range of 1 $\mu m^2$ of the layer (A-1) of a single-sided copper clad laminate were measured. The measurement conditions are as follows.

Probe: AC160TS-C3 (tip R<7 nm, spring constant: 26 N/m)

Measurement mode: AC-Air

Scan Rate: 1 Hz

(10) Wetting Tension of Fluororesin Film

Measured in accordance with JIS K6768:1999 by using a mixed liquid for a wetting tension test (manufactured by Wako Pure Chemical Industries, Ltd.).

(11) Evaluation of Transmission Loss of Hot Pressed Laminate

A transmission line was formed on a hot pressed laminate to obtain a printed circuit board, and with respect to signals of from 2 GHz to 90 GHz, transmission characteristics of high-frequency signals were evaluated by using a vector network analyzer (E8361A: manufactured by Keysight Technologies Inc.) and a high frequency contact probe of GSG (250 um pitch; manufactured by Picoprobe Co.). As the transmission line, a coplanar waveguide with a rear conductor (Conductor Backed Co-Planar Waveguide) was used. The characteristic impedance of the transmission line was set to be 50Ω; the gap width between the signal line and the ground conductor in the same plane was set to be 0.2 mm; the signal line width was set to be 0.39 mm on the laminated substrate comprising a FR-4 substrate and a layer (A-1) (fluororesin film), and set to be 0.36 mm on the FR-4 substrate. Gold-flash plating was applied on the surface of copper being a conductor of the printed circuit board. As the calibration method, a TRL calibration (Thru-Reflect-Line Calibration) was used. The length of the line was set to be 12.5 mm, and the transmission loss per unit length was measured.

With respect to the results of the transmission loss measurements, the vertical axis shows the circuit network parameter (S-parameter) representing the characteristics of the high frequency electronic circuit or high-frequency electronic component, and the horizontal axis shows the frequency.

(12) Evaluation of Surface Composition Ratios of Fluororesin Film

The surface was analyzed and measured by XPS (X-ray photoelectron spectroscopy).

Apparatus: Quantera-SXM, manufactured by ULVAC-φ Inc.

Beam diameter 100 μmφ,
Measurement area: 100×100 μm² (area analysis),
Detection angle: 45°.
<High-Resolution Spectral Acquisition Conditions>
Pass energy: 224 eV,
Energy step: 0.4 eV (quantitative mode).

(13) Water Contact Angle of the Surface of Fluororesin Film

By using DMo-701 manufactured by Kyowa Interface Science Co., Ltd., the contact angles were measured under conditions of a prepared liquid volume of 3 μL and a number of repeated times: five times, and the average value was calculated.

Production Example 1

By using TFE (tetrafluoroethylene), NAH (himic anhydride) and PPVE ($CF_2=CFO(CF_2)_3F$), fluorinated polymer X-1 was produced in the procedure as disclosed in [0123] of WO2016/017801.

The copolymerization composition of the fluorinated polymer X-1 was units derived from NAH/units derived from TFE/units derived from PPVE=0.1/97.9/2.0 (mol %). The fluorinated polymer X-1 had a melting point of 300° C., a dielectric constant (1 MHz) of 2.1, a melt flow temperature of 17.6 g/10 min, a melt viscosity at 300° C. of $10^3$ Pa·s, and an average particle size of 1,554 μm.

Then, by using a jet mill (manufactured by Seishin Enterprise Co., Ltd., a single track jet mill FS-4 Model), the fluorinated polymer X-1 was pulverized under conditions of a pulverization pressure of 0.5 MPa and treatment speed of 1 kg/hr, to obtain a resin powder (P-1). The resin powder (P-1) had D50 of 2.58 μm and D90 of 7.1 μm. The resin powder (P-1) had a loosely packing bulk density of 0.278 g/mL and a densely packing bulk density of 0.328 g/mL.

Example 1

120 g of the resin powder (P-1), 12 g of a nonionic surfactant (manufactured by Neos Company Limited, Ftergent 710FL) and 234 g of methyl ethyl ketone were put in a horizontal ball mill pot and dispersed by zirconia balls having a diameter of 15 mm to obtain a dispersion (C-1). The dispersion (C-1) was applied on a copper foil with a thickness of 12 μm (manufactured by Fukuda Metal Foil Powder Co. Ltd., CF-T4X-SV), dried at 100° C. for 15 minutes under a nitrogen atmosphere, and heated at 350° C. for 15 minutes, followed by annealing, to obtain a single-sided copper clad laminate having a layer (A-1) with a thickness of 5 μm.

The surface of the layer (A-1) of the obtained single-sided copper clad laminate was plasma-treated. As the plasma treatment apparatus, AP-1000 of NORDSON MARCH Corporation was used. As the plasma treatment conditions, the RF output of AP-1000 was set to be 300 W, the gap between electrodes was set to be 2 inches, the type of the introduced gas was argon (Ar), the flow rate of the introduced gas was set to be 50 cm³/min, the pressure was set to be 13 Pa, and the treatment time was set to be 1 minute. The arithmetic average roughness Ra of the surface of the layer (A-1) after the plasma treatment was 2.5 μm. Further, Ra (AFM) was 14.5 nm, and Rz (AFM) was 195 nm. The wetting tension of the plasma-treated surface of the layer (A-1) of the single-sided copper clad laminate was 54 mN/m. Further, the wetting tension of the surface of the layer (A-1) before the plasma pretreatment was at most 22.6 mN/m.

Further, the copper foil of the single-sided copper clad laminate after the plasma treatment was removed by hydrochloric acid treatment, whereby it was confirmed that it was possible to obtain a single film made of the layer (A-1).

On the layer (A-1) side of the single-sided copper foil laminate within 72 hours after the surface treatment, FR-4 series as a prepreg (manufactured by Hitachi Chemical Company, Ltd., reinforcing fiber: glass fiber, matrix resin: epoxy resin, product name: GEA-67N 0.2 t (HAN), thickness: 0.2 mm, curing temperature: lower than 185° C.) was overlaid and subjected to vacuum hot pressing under the conditions of a pressing temperature of 185° C., a pressing pressure of 3.0 MPa and a pressing time of 60 minutes to obtain a hot pressed laminate. The dielectric constant (20 GHz) was 4.32, and the dielectric loss tangent (20 GHz) was 0.01568. Here, if there was no layer (A-1) (i.e. if the copper foil and the prepreg were directly in contact; the same applies hereinafter), the dielectric constant (20 GHz) was 4.56, and the dielectric loss tangent (20 GHz) was 0.01574.

Further, this time, the prepreg was laminated within 72 hours after the plasma treatment, but the effect of the plasma treatment continues for one year.

Example 2 to 6

A single-sided copper-clad laminate was prepared in the same manner as in Example 1 except that plasma treatment conditions were changed as shown in Table 1, and a hot pressed laminate was obtained in the same manner as Example 1 except that said single-sided copper clad laminate was used.

Example 7

After preparing a single-sided copper-clad laminate in the same manner as in Example 1, by changing the prepreg to ES-3317B (manufactured by Risho Kogyo Co., Ltd., matrix resin: polyphenylene ether resin, 340 mm×340 mm, thickness: 0.1 mm, curing temperature: less than 180° C.), a hot pressed laminate was obtained under the conditions of a press temperature of 180° C., a pressing pressure of 5.0 MPa and a pressing time of 60 minutes. The dielectric constant (20 GHz) was 3.57, and the dielectric loss tangent (20 GHz) was 0.009.

Here, if there was no layer (A-1), the peel strength was 5.2 N/10 mm. The dielectric constant (20 GHz) was 3.72, and the dielectric loss tangent (20 GHz) was 0.009.

Example 8

After preparing a single-sided copper-clad laminate in the same manner as in Example 1, by changing the prepreg to a LCP film (CTZ-50) manufactured by Kuraray Co., Ltd., a hot pressed laminate was obtained under the pressing conditions of a pressing temperature of 310° C., a pressing pressure of 4.0 MPa and a pressing time of 10 minutes.

Here, if there was no layer (A-1), the peel strength was 1.9 N/10 mm.

Example 9

After preparing a single-sided copper-clad laminate in the same manner as in Example 1, by changing the prepreg to RO4450F (manufactured by Rogers Corporation, product name: RO4450F, thickness: 0.101 mm, curing temperature: less than 180° C.), a hot pressed laminate was obtained under the conditions of a pressing temperature of 180° C., a pressing pressure of 3.5 MPa and a pressing time of 60 minutes.

Here, if there was no layer (A-1), the peel strength was 2.6 N/10 mm.

Example 10

After preparing a single-sided copper-clad laminate in the same manner as in Example 1, by changing the prepreg to RO4450B (manufactured by Rogers Corporation, product name: RO4450B, thickness: 0.101 mm, curing temperature: lower than 180° C.), a hot pressed laminate was obtained under the conditions of a pressing temperature of 180° C., a pressing pressure of 3.5 MPa and a pressing time of 60 minutes.

Here, if there was no layer (A-1), the peel strength was 3.4 N/10 mm.

Example 11

A hot pressed laminate was obtained in the same manner as in Example 1, except that as the copper foil, HS1-VSP manufactured by Mitsui Mining & Smelting Co., Ltd. was used.

The dielectric constant (20 GHz) was 4.51, and the dielectric loss tangent (20 GHz) was 0.01511. Here, if there was no layer (A-1), the dielectric constant (20 GHz) was 4.56, and the dielectric loss tangent (20 GHz) was 0.01611.

Example 12

A hot pressed laminate was obtained in the same manner as in Example 7, except that as the copper foil, HS1-VSP manufactured by Mitsui Mining & Smelting Co., Ltd. was used.

Comparative Example 1

A hot pressed laminate was obtained in the same manner as in Example 1 except that no plasma treatment was applied on the surface of the layer (A-1) of the single-sided copper clad laminate.

The plasma treatment conditions in each Example, as well as the measurement results of the arithmetic average roughness Ra, Ra (AFM) and Rz (AFM) of the surface of the layer (A-1) after plasma treatment, and the peel strength between the layer (A-1) and the layer made of the prepreg, are shown in Table 1.

TABLE 1

| | Plasma treatment conditions | | | | | | Surface of bonding layer | AFM | | |
|---|---|---|---|---|---|---|---|---|---|---|
| | Gap between electrodes [inches] | Introduced gas Type | Flow rate [cm³/min] | Pressure [Pa] | RF output [W] | Treating time [min] | Arithmetic average roughness Ra [μm] | Arithmetic average roughness Ra [nm] | Arithmetic average roughness Rz [nm] | Peel strength [N/10 mm] |
| Example 1 | 2 | Ar | 50 | 13 | 300 | 1 | 2.5 | 14.5 | 195 | 11.3 |
| Example 2 | 2 | Ar | 50 | 13 | 300 | 2 | 2.7 | 15 | 200 | 12.5 |
| Example 3 | 1 | Ar | 10 | 5 | 300 | 1 | 2.5 | 13.4 | 180 | 10.5 |
| Example 4 | 1 | Ar | 10 | 5 | 300 | 2 | 2.3 | 12.4 | 130 | 10.1 |
| Example 5 | 2 | Ar | 50 | 13 | 300 | 5 | — | 12.1 | 119 | 9.9 |
| Example 6 | 2 | Ar | 50 | 13 | 450 | 2 | — | 13.4 | 130 | 7.7 |
| Example 7 | 2 | Ar | 50 | 13 | 300 | 2 | — | 15 | 190 | 7.8 |
| Example 8 | 2 | Ar | 50 | 13 | 300 | 2 | — | 13 | 180 | 5.5 |
| Example 9 | 2 | Ar | 50 | 13 | 300 | 2 | — | 15 | 210 | 7.7 |
| Example 10 | 2 | Ar | 50 | 13 | 300 | 2 | — | 14 | 200 | 10 |
| Example 11 | 2 | Ar | 50 | 13 | 300 | 2 | — | 16 | 210 | 14 |
| Example 12 | 2 | Ar | 50 | 13 | 300 | 2 | — | 14 | 200 | 12 |
| Comparative Example 1 | — | — | — | — | — | — | 1.6 | 2.4 | 70 | 1.7 |

As shown in Table 1, in Examples 1, 2, 5 to 12 wherein Ra (AFM) of the surface of the layer (A-1) was at least 3.0 nm, the peel strength at the interface between the layer (A-1) and the layer made of the prepreg, was higher, and the interlayer adhesion was excellent, as compared to Comparative Example 1.

Example 13

Figure 3:
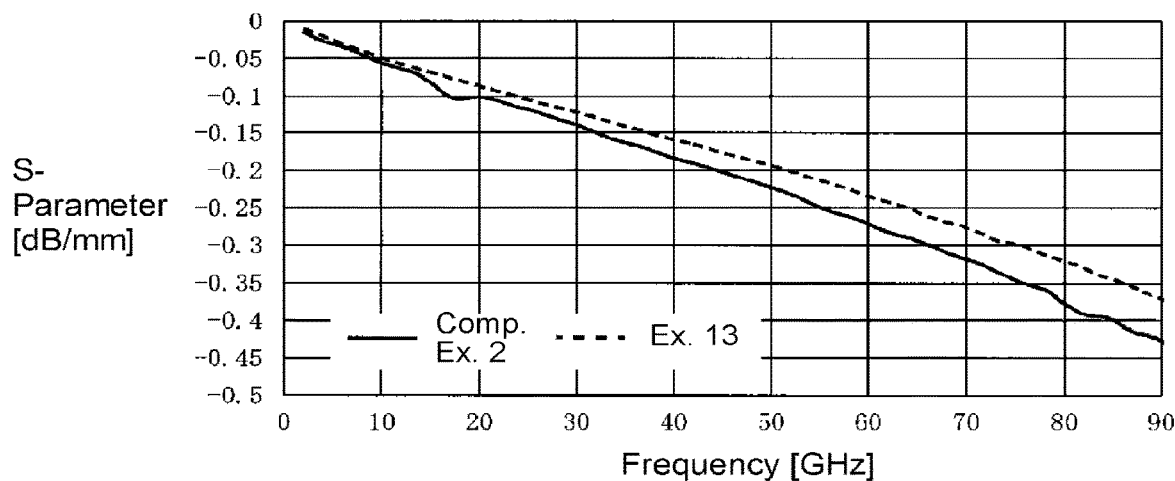
FIG. 3 is a graph showing the results of transmission loss measurements in Example 13 and Comparative Example 2.

Two sheets of the single-sided copper-clad laminate after the plasma treatment as described in Example 1, were prepared, and on each of the two sides of FR-4, said single-sided copper clad laminate was overlaid directly at the layer (A-1) side, followed by vacuum hot pressing in the same manner as in Example 1 to obtain a hot pressed laminate. On the obtained hot pressed laminate (double-sided copper clad laminate), a circuit was formed, followed by measurements. The evaluation results of the transmission loss of the hot pressed laminate are shown in FIG. 3.

Example 14

Figure 4:
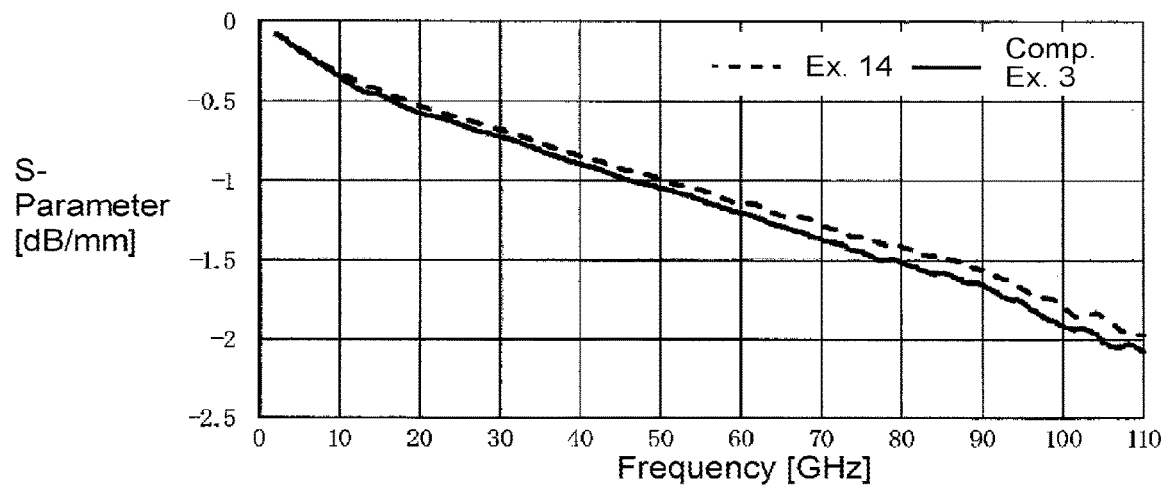
FIG. 4 is a graph showing the results of transmission loss measurements in Example 14 and Comparative Example 3.

Two sheets of the single-sided copper-clad laminate after the plasma treatment as described in Example 1, were prepared, and on each of the two sides of R-5680 (NJ) (thickness: 0.1 mm), said single-sided copper clad laminate was overlaid at the layer (A-1) side (so that (R-5680 (NJ) and the layer (A-1) were in direct contact), followed by vacuum hot pressing in the same manner as in Example 1 except that treatment was conducted at 195° C. for 75 minutes under 3.5 MPa, to obtain a hot pressed laminate. On the obtained hot pressed laminate (double-sided copper clad laminate), a circuit was formed, followed by measurements. The evaluation results of the transmission loss of the hot pressed laminate are shown in FIG. 4.

Example 15

Figure 5:
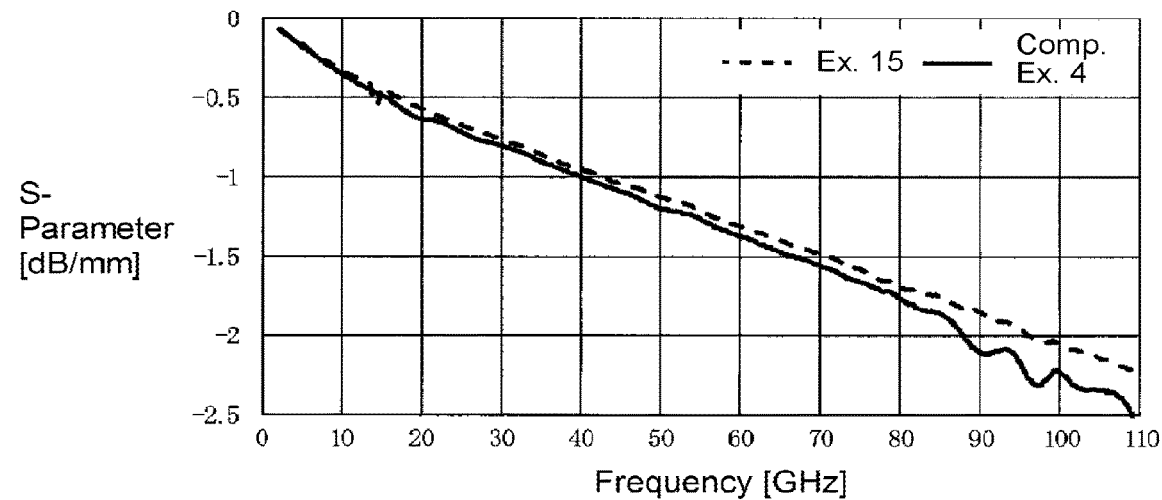
FIG. 5 is a graph showing the results of transmission loss measurements in Example 15 and Comparative Example 4.

Two sheets of the single-sided copper-clad laminate after the plasma treatment as described in Example 1, were prepared, and on each of the two sides of R-5680 (J) (thickness: 0.1 mm), said single-sided copper clad laminate was overlaid at the layer (A-1) side (so that (R-5680 (J) and the layer (A-1) were in direct contact), followed by vacuum hot pressing in the same manner as in Example 1 except that treatment was conducted at 195° C. for 75 minutes under 3.5 MPa, to obtain a hot pressed laminate. On the obtained hot pressed laminate (double-sided copper clad laminate), a circuit was formed, followed by measurements. The evaluation results of the transmission loss of the hot pressed laminate are shown in FIG. 5.

Comparative Example 2

A copper foil was directly overlaid on each side of FR-4, followed by vacuum hot pressing in the same manner as in Example 1 to obtain a hot pressed laminate. A circuit was formed on the hot pressed laminate (double-sided copper clad laminate), followed by measurements. The evaluation results of the transmission loss of the hot pressed laminate are shown in FIG. 3.

Comparative Example 3

A copper foil was directly overlaid on each side of R-5680 (NJ), followed by vacuum hot pressing in the same manner as in Example 1 to obtain a hot pressed laminate. A circuit was formed on the hot pressed laminate (double-sided copper clad laminate), followed by measurements. The evaluation of the transmission loss of the hot pressed laminate is shown in FIG. 4.

Comparative Example 4

A copper foil was directly overlaid on each side of R-5680 (J), followed by vacuum hot pressing in the same manner as in Example 1 to obtain a hot pressed laminate. A circuit was formed on the hot pressed laminate (double-sided copper clad laminate), followed by measurements. The evaluation of the transmission loss of the hot pressed laminate is shown in FIG. 5.

From Examples 13 to 15 and Comparative Examples 2 to 4, it is evident that the hot pressed laminate having the layer (A-1) had a low transmission loss.

Example 16

A hot pressed laminate was obtained by vacuum hot pressing in the same manner as in Example 1 except that the layer (A-1) was formed on a shine surface side i.e. not a surface treated side, of CF-T4X-SV as a copper foil manufactured by Fukuda Metal Foil & Powder Co. Ltd. The peel strength was 10.2 N/10 mm.

Here, if there was no layer (A-1), the peel strength was 3.5 N/10 mm.

Example 17

A hot pressed laminate was obtained by vacuum hot pressing in the same manner as in Example 7 except that the layer (A-1) was formed on a shine surface side i.e. not a surface treated side, of HS1-VSP as a copper foil manufactured by Mitsui Mining & Smelting Co., Ltd. The peel strength was 11.7 N/10 mm.

Here, if there was no layer (A-1), the peel strength was 3.5 N/10 mm.

Example 18

After preparing a single-sided copper-clad laminate in the same manner as in Example 1 except that as a copper foil, HS1-VSP manufactured by Mitsui Mining & Smelting Co., Ltd., was used, by changing the prepreg to a Megtron 7 Series (manufactured by Panasonic Corporation, product name: R-5680 (J), thickness: 0.101 mm, curing temperature: lower than 195° C.), vacuum hot pressing was conducted under the conditions of a pressing temperature of 195° C., a pressing pressure of 3.5 MPa, and a pressing time of 75 minutes, to obtain a hot pressed laminate. The peel strength was 10.0 N/10 mm. The dielectric constant (20 GHz) was 3.54, and the dielectric loss tangent (20 GHz) was 0.00473.

Further, if there was no layer (A-1), the dielectric constant (20 GHz) was 3.55, and the dielectric loss tangent (20 GHz) was 0.0048.

Example 19

After preparing a single-sided copper-clad laminate in the same manner as in Example 1 except that as a copper foil, HS1-VSP manufactured by Mitsui Mining & Smelting Co., Ltd., was used, by changing the prepreg to a Megtron 7 Series (manufactured by Panasonic Corporation, product name: R-5680 (NJ), thickness: 0.101 mm, curing temperature: lower than 195° C.), vacuum hot pressing was conducted under the conditions of a pressing temperature of 195° C., a pressing pressure of 3.5 MPa, and a pressing time of 60 minutes, to obtain a hot pressed laminate. The peel strength was 11.9 N/10 mm. The dielectric constant (20 GHz) was 3.16, and the dielectric loss tangent (20 GHz) was 0.00270.

Further, if there was no layer (A-1), the dielectric constant (20 GHz) was 3.23, and the dielectric loss tangent (20 GHz) was 0.00280.

Example 20

After preparing a single-sided copper-clad laminate in the same manner as in Example 1 except that a shine surface i.e. not a surface treated side of HS1-VSP as a copper foil, manufactured by Mitsui Mining & Smelting Co., Ltd., was used, by changing the prepreg to a Megtron 7 series (manufactured by Panasonic Corporation, product name: R-5680 (NJ)), vacuum hot pressing was conducted under the conditions of a pressing temperature of 195° C., a pressing pressure of 3.5 MPa, and a pressing time of 60 minutes, to obtain a hot pressed laminate. The peel strength was 10.0 N/10 mm. The dielectric constant (20 GHz) was 3.048, and the dielectric loss tangent (20 GHz) was 0.00266.

Further, if there was no layer (A-1), the peel strength was 2.7 N/10 mm, the dielectric constant (20 GHz) was 3.22, and the dielectric loss tangent (20 GHz) was 0.00273.

Example 21

Figure 6:
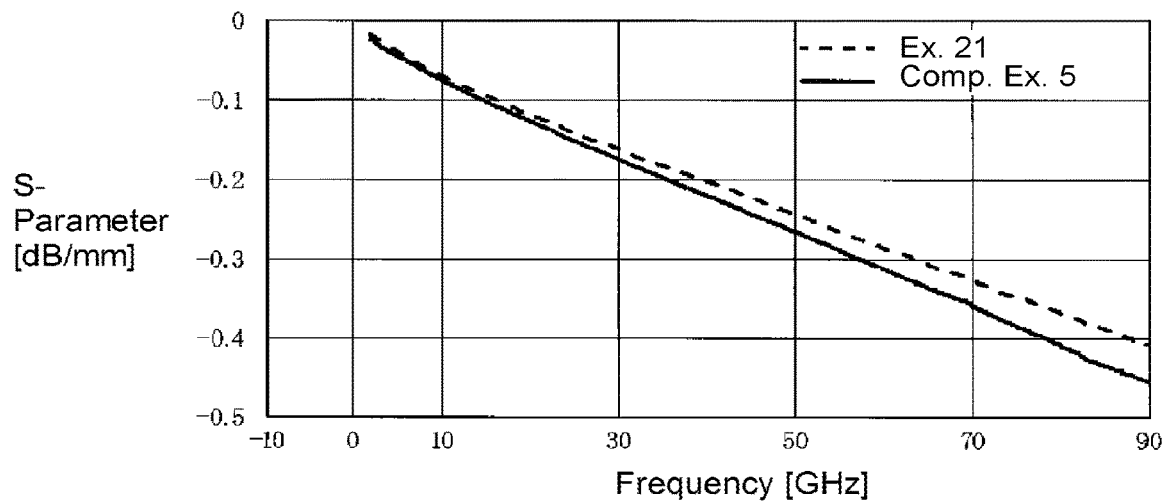
FIG. 6 is a graph showing the results of transmission loss measurements in Example 21 and Comparative Example 5.

After preparing a single-sided copper-clad laminate in the same manner as in Example 1 except that as a copper foil, HS1-VSP manufactured by Mitsui Mining & Smelting Co., Ltd., was used, by changing the prepreg to FR-4, vacuum hot pressing was conducted under the conditions of a pressing temperature of 175° C., a pressing pressure of 2.5 MPa, and a pressing time of 65 minutes, to obtain a hot pressed laminate. The peel strength was 10.0 N/10 mm. The evaluation of the transmission loss of the hot pressed laminate is shown in FIG. 6. The dielectric constant (20 GHz) was 4.33, and the dielectric loss tangent (20 GHz) was 0.01752. Further, if there was no layer (A-1), the dielectric constant (20 GHz) was 4.51, and the dielectric loss tangent (20 GHz) was 0.01790.

Comparative Example 5

A copper foil was directly overlaid on each side of R-1755C, and vacuum hot pressing was conducted in the same manner as in Example 1 to obtain a hot pressed laminate. A circuit was formed on the laminate, followed by measurements. The evaluation of the transmission loss of the laminate is shown in FIG. 6.

Example 22

Figure 7:
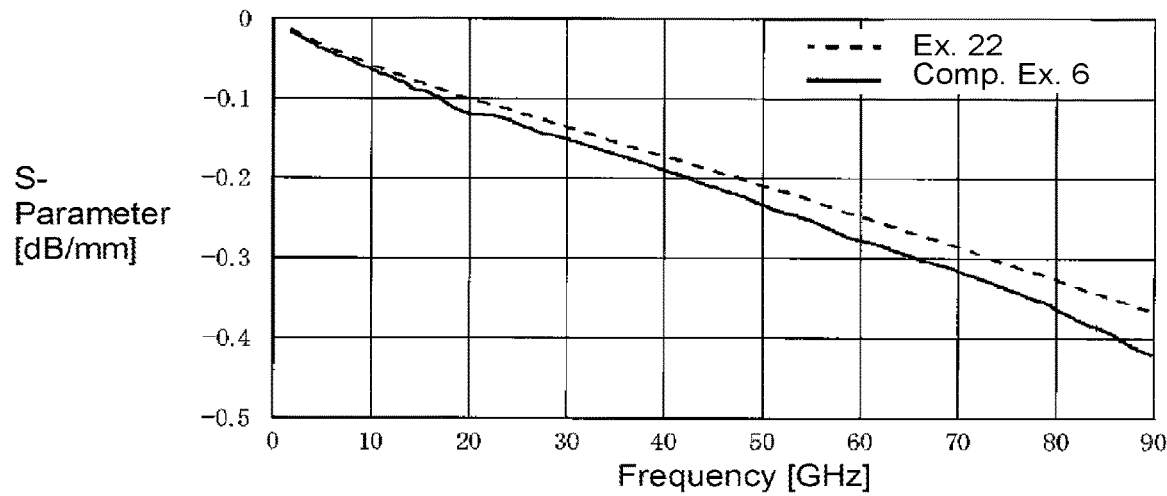
FIG. 7 is a graph showing the results of transmission loss measurements in Example 22 and Comparative Example 6.

After preparing a single-sided copper-clad laminate in the same manner as in Example 1 except that as a copper foil, HS1-VSP manufactured by Mitsui Mining & Smelting Co., Ltd., was used, by changing the prepreg to a FR-4 series (product name: EI-6765, thickness: 0.101 mm), vacuum hot pressing was conducted under the conditions of a pressing temperature of 175° C., a pressing pressure of 3.5 MPa, and a pressing time of 50 minutes, to obtain a hot pressed laminate. The peel strength was 10.7 N/10 mm. The evaluation of the transmission loss of the hot pressed laminate is shown in FIG. 7. The dielectric constant (20 GHz) was 3.98, and the dielectric loss tangent (20 GHz) was 0.01932. Further, if there was no layer (A-1), the dielectric constant (20 GHz) was 4.21, and the dielectric loss tangent (20 GHz) was 0.01960.

Comparative Example 6

A copper foil was directly overlaid on each side of EI-6765, and vacuum hot pressing was conducted in the same manner as in Example 1 to obtain a hot-pressed laminate. A circuit was formed on the laminate, followed by measurements. The evaluation of the transmission loss of the laminate is shown in FIG. 7.

Example 23

By preparing a single-sided copper clad laminate in the same manner as in Example 1 except that the gas species for the vacuum plasma treatment was changed to a mixed gas comprising 70 vol % of hydrogen and 30 vol % of nitrogen, a hot pressed laminate was obtained. The peel strength was 11.3 N/10 mm.

Example 24

By preparing a single-sided copper clad laminate in the same manner as in Example 1 except that the gas species for the vacuum plasma treatment was changed to a mixed gas (oxygen concentration: at most 1 ppm) comprising 35 vol % of hydrogen, 15 vol % of nitrogen and 50 vol % of argon, a hot pressed laminate was obtained. The peel strength was 10.9 N/10 mm.

Example 25

By preparing a single-sided copper clad laminate in the same manner as in Example 1 except that the gas species for the vacuum plasma treatment was changed to a mixed gas (oxygen concentration: at most 1 ppm) comprising 50 vol % of hydrogen and 50 vol % of argon, a hot pressed laminate was obtained. The amounts of elements were 34.5% of carbon, 1.3% of oxygen and 64.2% of fluorine.

Example 26

A hot pressed laminate was obtained in the same manner as in Example 1 except that the resin powder (P-1) was changed to P-63B being a commercially available PFA (manufactured by Asahi Glass Co., Ltd., melting point: 310° C.).

Comparative Example 7

A hot pressed laminate was obtained in the same manner as in Example 26, except that no plasma treatment was applied.

In Examples 2, 5, 6, 23, 24, 25 and 26, and Comparative Examples 1 and 7, the results of the elemental analysis of the plasma-treated surface of the layer (A-1) (fluororesin film), and the results of the measurements of the wetting tension, the water contact angle, and the peel strength, are shown in Table 2.

TABLE 2

| | Gas species for surface treatment | Surface composition of plasma-treated surface | | | | Wetting tension [mN/m] | Water contact angle [°] | Peel strength [N/10 mm] |
|---|---|---|---|---|---|---|---|---|
| | | C [%] | N [%] | O [%] | F [%] | | | |
| Example 2 | Ar | 41.2 | | 5.3 | 53.5 | 60 | 96 | 12.5 |
| Example 5 | Ar | 42.9 | | 5.5 | 53.5 | | 110 | 9.9 |
| Example 6 | Ar | 46.6 | | 6.2 | 47.2 | | 98 | 7.7 |
| Example 23 | $H_2/N_2$ | 55.4 | 7 | 7.1 | 30.5 | | | 11.3 |
| Example 24 | $H_2/N_2/Ar$ | 50.4 | 3.5 | 6.5 | 39.6 | | | 10.9 |
| Example 25 | $H_2/Ar$ | | | | | | | |
| Example 26 | Ar | 37.3 | | 3.4 | 59.3 | 30 | | 6.7 |
| Comparative Example 1 | — | 31.4 | | 0.9 | 67.7 | | 115 | 1.7 |
| Comparative Example 7 | — | 31.4 | | 0 | 68.6 | 20.2 | | 1.2 |

Example 27

After peeling off copper foils from a core material (manufactured by Panasonic Corporation, product name: R-5776, 340 mm×340 mm, thickness: 0.6 mm), on each side of the core material, a Megtron 6 series as a prepreg (manufactured by Panasonic Corporation, product name: R-5670, 340 mm×340 mm, thickness: 0.2 mm, curing temperature: lower than 195° C.) was formed. On each prepreg surface, one sheet of the single-sided copper-clad laminate in Example 1 was placed so that the copper foil constitutes the outermost layer, and hot pressing was conducted under the conditions of a pressing temperature of 195° C., a pressing pressure of 4.0 MPa and a pressing time of 90 minutes, to obtain a hot pressed laminate.

A transmission line was formed on the hot pressed laminate, and its transmission loss was measured by the microstrip line, whereby the transmission loss at 20 GHz was 4.7 dB, which was smaller by 16% as compared to the evaluation result (5.6 dB) of the transmission line of the hot pressed laminate having the same construction except that it did not have the layer (A-1).

This application is a continuation of PCT Application No. PCT/JP2018/019144, filed on May 17, 2018, which is based upon and claims the benefit of priority from Japanese Patent Application No. 2017-099295 filed on May 18, 2017, Japanese Patent Application No. 2017-165991 filed on Aug. 30, 2017 and Japanese Patent Application No. 2018-010004 filed on Jan. 24, 2018. The contents of those applications are incorporated herein by reference in their entireties.

What is claimed is:

1. A laminate comprising:
    a layer A comprising an adhesive fluororesin having a melting point of from 260 to 380° C. and having at least one functional group selected from the group consisting of a carbonyl group-containing group, a hydroxy group, an epoxy group, an amide group, an amino group and an isocyanate group, and
    a layer B comprising a metal,
    wherein one side of layer A is laminated directly to one side of layer B,
    wherein the adhesive fluororesin is a fluorinated polymer having a unit with an adhesive functional group or a terminal group with an adhesive functional group,
    wherein the surface of layer A has an arithmetic average roughness Ra of at least 3.0 nm and a maximum height Rz of at least 80.0 nm when a 1 µm² area of the surface is measured by an atomic force microscope.

2. The laminate of claim 1, wherein the adhesive fluororesin comprises a tetrafluoroethylene polymer, of which a melt viscosity at 380° C. is from $1 \times 10^2$ to $1 \times 10^6$ Pa·s.

3. The laminate of claim 1, wherein a composition ratio of oxygen atoms at the surface to a total of carbon atoms, fluorine atoms and oxygen atoms at the surface is at least 1%.

4. The laminate of claim 1, wherein a composition ratio of fluorine atoms at the surface to a total of carbon atoms, fluorine atoms and oxygen atoms at the surface is at least 25% and at most 65%.

5. The laminate of claim 1, wherein the metal of layer B is a layer of copper foil, and a maximum height Rz of surface roughness measured based on JIS C6515: 1998 (IEC61249-5-1: 1995) of the copper foil, is at least 1 nm and at most 2.5 µm.

6. The laminate of claim 1, wherein a peel strength at an interface between the directly laminated layers A and B is at least 5 N/10 mm, and wherein a dielectric constant (20 GHz) is less than 3.6.

7. The laminate of claim 6, wherein a composition ratio of oxygen atoms at the surface in contact with the layer B of the layer A to a total of carbon atoms, fluorine atoms and oxygen atoms at the surface in contact with the layer B of the layer A is at least 1%, and
    a composition ratio of fluorine atoms at the surface in contact with the layer B of the layer A to the total of carbon atoms, fluorine atoms and oxygen atoms is at least 25% and at most 65%.

8. The laminate of claim 1, wherein the arithmetic average roughness Ra is at least 12 nm.

9. The laminate of claim 1, wherein the arithmetic average roughness Ra is at least 12.1 nm and at most 16 nm.

10. The laminate of claim 1, wherein the maximum height Rz is at least 119 nm and at most 210 nm.

11. The laminate of claim 1, wherein the arithmetic average roughness Ra is at least 12.1 nm and at most 16 nm, and
    the maximum height Rz is at least 119 nm and at most 210 nm.

12. The laminate of claim 1, wherein the adhesive fluororesin has a melting point of from 260 to 320° C.

13. A method for producing a hot pressed laminate using the laminate of claim 1, the method comprising laminating by hot pressing an object to be laminated, to the surface of the laminate.

14. The method of claim 13, wherein the hot pressing is conducted at a temperature of at most the melting point of the adhesive fluororesin.

15. A method for producing a hot pressed laminate using the laminate of claim 1 comprising:
- surface-treating a fluororesin film of the laminate, wherein the fluororesin film containing a fluororesin having a melting point of from 260° C. to 380° C. to obtain a fluororesin film, of which the wetting tension of at least one surface in the thickness direction is at least 30 mN/m, and
- laminating an object to be laminated, on said surface with a wetting tension of at least 30 mN/m of the obtained fluororesin film by hot pressing at a temperature of at most the melting point of the fluororesin.

\* \* \* \* \*